(12) United States Patent
Miyamoto et al.

(10) Patent No.: US 7,819,670 B2
(45) Date of Patent: Oct. 26, 2010

(54) CONNECTOR WHICH CAN BE REDUCED IN WARPAGE

(75) Inventors: Kunikazu Miyamoto, Tokyo (JP); Kazuomi Sato, Saitama (JP); Kazuaki Ibaraki, Tokyo (JP); Masao Higuchi, Tokyo (JP); Takeharu Naitou, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 12/287,803

(22) Filed: Oct. 14, 2008

(65) Prior Publication Data

US 2009/0075496 A1 Mar. 19, 2009

Related U.S. Application Data

(62) Division of application No. 11/140,705, filed on May 31, 2005, now Pat. No. 7,651,338.

(30) Foreign Application Priority Data

| May 31, 2004 | (JP) | ............................ 2004-161644 |
| Oct. 8, 2004 | (JP) | ............................ 2004-296616 |

(51) Int. Cl.
 *H01R 12/00* (2006.01)
(52) U.S. Cl. ............................ 439/66; 439/74; 439/862
(58) Field of Classification Search ................... 439/66, 439/74, 630, 862
See application file for complete search history.

(56) References Cited

U.S. PATENT DOCUMENTS

| 6,068,517 A | 5/2000 | Tanaka |
| 6,120,328 A | 9/2000 | Bricaud et al. |
| 6,227,877 B1 | 5/2001 | Mou et al. |
| 6,244,911 B1 | 6/2001 | Heim |
| 6,296,495 B1 | 10/2001 | Wang et al. |
| 6,305,960 B1 * | 10/2001 | Fan ............................ 439/188 |
| 6,328,573 B1 | 12/2001 | Sakata et al. |
| 6,585,535 B2 * | 7/2003 | Murr et al. .................. 439/331 |
| 6,638,078 B2 | 10/2003 | Hashiguchi et al. |
| 6,827,586 B2 | 12/2004 | Noda et al. |
| 6,926,536 B2 | 8/2005 | Ochiai |

(Continued)

FOREIGN PATENT DOCUMENTS

JP  10-172694  6/1998

(Continued)

OTHER PUBLICATIONS

European Search Report.

(Continued)

*Primary Examiner*—Xuong M Chung-Trans
(74) *Attorney, Agent, or Firm*—Collard & Roe, P.C.

(57) ABSTRACT

In a connector for connecting first and second connection objects faced to each other, a conductive contact includes a holding portion held by an insulator, a first spring portion, and a second spring portion connected to the first spring portion. The first spring portion extends from the holding portion in one direction and has a first contacting portion to be connected to the first connection object. The second spring portion extends in the other direction opposite to the one direction and has a free end provided with a second contacting portion to be connected to the second connection object.

9 Claims, 18 Drawing Sheets

U.S. PATENT DOCUMENTS

| | | |
|---|---|---|
| 6,969,263 B2 | 11/2005 | Chen et al. |
| 6,991,472 B2 | 1/2006 | Du et al. |
| 2003/0162417 A1 | 8/2003 | Hashiguchi et al. |
| 2004/0023528 A1 | 2/2004 | Nishio et al. |

FOREIGN PATENT DOCUMENTS

| | | |
|---|---|---|
| JP | 11-339907 | 12/1999 |
| JP | 2000-100500 | 4/2000 |
| JP | 2001-143829 | 5/2001 |
| JP | 2003-163045 | 6/2003 |
| JP | 2003-282167 | 10/2003 |
| TW | 566694 | 12/2003 |

OTHER PUBLICATIONS

Japanese Office Action dated Aug. 22, 2007.

* cited by examiner

CONNECTOR WHICH CAN BE REDUCED IN WARPAGE

CROSS-REFERENCE TO RELATED APPLICATIONS

This is a divisional application of U.S. patent application Ser. No. 11/140,705, filed May 31, 2005 now U.S. Pat. No. 7,651,338. Priority is claimed under 35 U.S.C. §119 of Japanese Applications No. 2004-161644, filed May 31, 2004 and No. 2004-296616, filed Oct. 8, 2004.

BACKGROUND OF THE INVENTION

This invention relates to a connector for electrically connecting connection objects, such as a printed board and a FPC (flexible printed circuit).

As a connector of the type, Japanese Unexamined Patent Application Publication (JP-A) No. H11-339907 discloses a connector for connecting two printed boards faced to each other. The connector comprises an elastic contact having a fixed part fixedly attached to a housing and one and the other split parts branched from one end of the fixed part. The one and the other split parts are disposed in an opening portion of the housing and led out to one and the other surfaces of the housing, respectively.

In the connector, the one and the other split parts as contacting portions of the contact are formed by a single integral component but are independent from each other as spring members. Therefore, it is difficult to achieve a sufficiently high contacting force while suppressing stress so as to prevent occurrence of permanent strain in the one and the other split parts. Further, the housing may possibly be damaged by stress concentration to an area where the fixed part is fixed to the housing. In addition, since the contacting portions of each single contact are shifted in pitch from each other, a narrow pitch can not be achieved so that the connector is increased in size.

As another connector of the type, Japanese Unexamined Patent Application Publication (JP-A) No. 2003-163045 discloses an electrical contact element having a fixed support portion engaged with and held by a holder, a first contact spring part to be brought into press contact with an electronic component, and a second contact spring part to be brought into press contact with a printed board. The first and the second contact spring parts are connected to one end of the fixed support portion and are generally symmetrically folded on upper and lower sides of the fixed support portion. Each of the first and the second contact spring parts has a bent portion formed at an intermediate peak point to serve as a movable contact point, and a free end folded back towards the fixed support portion to form an elastic support portion. However, the above-mentioned structure is not suitable for reduction in profile of the connector.

As still another connector of the type, U.S. Pat. No. 6,328,573 discloses an electrical connector comprising an S-shaped contact formed by press punching and arranged in an opening portion of a housing. The contact has holding portions formed at opposite ends thereof and supported by the housing. In the electrical connector, the contact is bent in an S shape and has contact points formed at opposite sides of an S-shaped portion. The contact points are brought into contact with lands of printed boards faced to each other, respectively. In this manner, the printed boards are electrically connected to each other.

However, since the contact is formed by press punching, the lands of the printed boards may possibly be chipped away by sheared edges of cut surfaces of the contact points when the contact points are brought into contact with the lands. Further, since the contact is merely bent into a generally S shape, the shape of the contact points is not definitely fixed. Consequently, it is difficult to assure stable electrical connection. Following reduction in profile of the connector, an insulator of the connector is reduced in thickness. Therefore, as the number of contacts is increased, opposite ends of the insulator are increasingly warped due to reactive force of the contacts upon assembling the connector to connect the printed boards. Thus, the above-mentioned connector is disadvantageous in assemblability.

SUMMARY OF THE INVENTION

It is therefore an object of this invention to provide a connector which is capable of achieving large displacement and sufficient contacting force and of suppressing an influence upon an insulator in an area around a holding portion.

It is another object of this invention to provide a connector comprising a contact having a spring shape allowing reduction in profile of the connector.

It is still another object of this invention to provide a connector which is capable of reducing an influence of warpage of an insulator upon assembling and of preventing occurrence of warpage of the insulator.

Other objects of the present invention will become clear as the description proceeds.

According to an aspect of the present invention, there is provided a connector for connecting first and second connection objects faced to each other, the connector comprising an insulator and a conductive contact coupled to the insulator, the contact comprising a holding portion held by the insulator, a first spring portion extending from the holding portion in one direction and having a first contacting portion to be connected to the first connection object, and a second spring portion connected to the first spring portion, extending in the other direction opposite to the one direction, and having a free end provided with a second contacting portion to be connected to the second connection object.

According to another aspect of the present invention, there is provided a connector for connecting first and second connection objects faced to each other, the connector comprising an insulator and a plurality of conductive contacts disposed on a predetermined plane and coupled to the insulator, each of the contacts having a holding portion held by the insulator, a first spring portion extending from the holding portion in one direction and having a first contacting portion to be connected to the first connection object, and a second spring portion connected to the first spring portion, extending in the other direction opposite to the one direction, and having a free end provided with a second contacting portion to be connected to the second connection object.

BRIEF DESCRIPTION OF THE INVENTION

DESCRIPTION OF THE PREFERRED EMBODIMENTS

Figure 1:
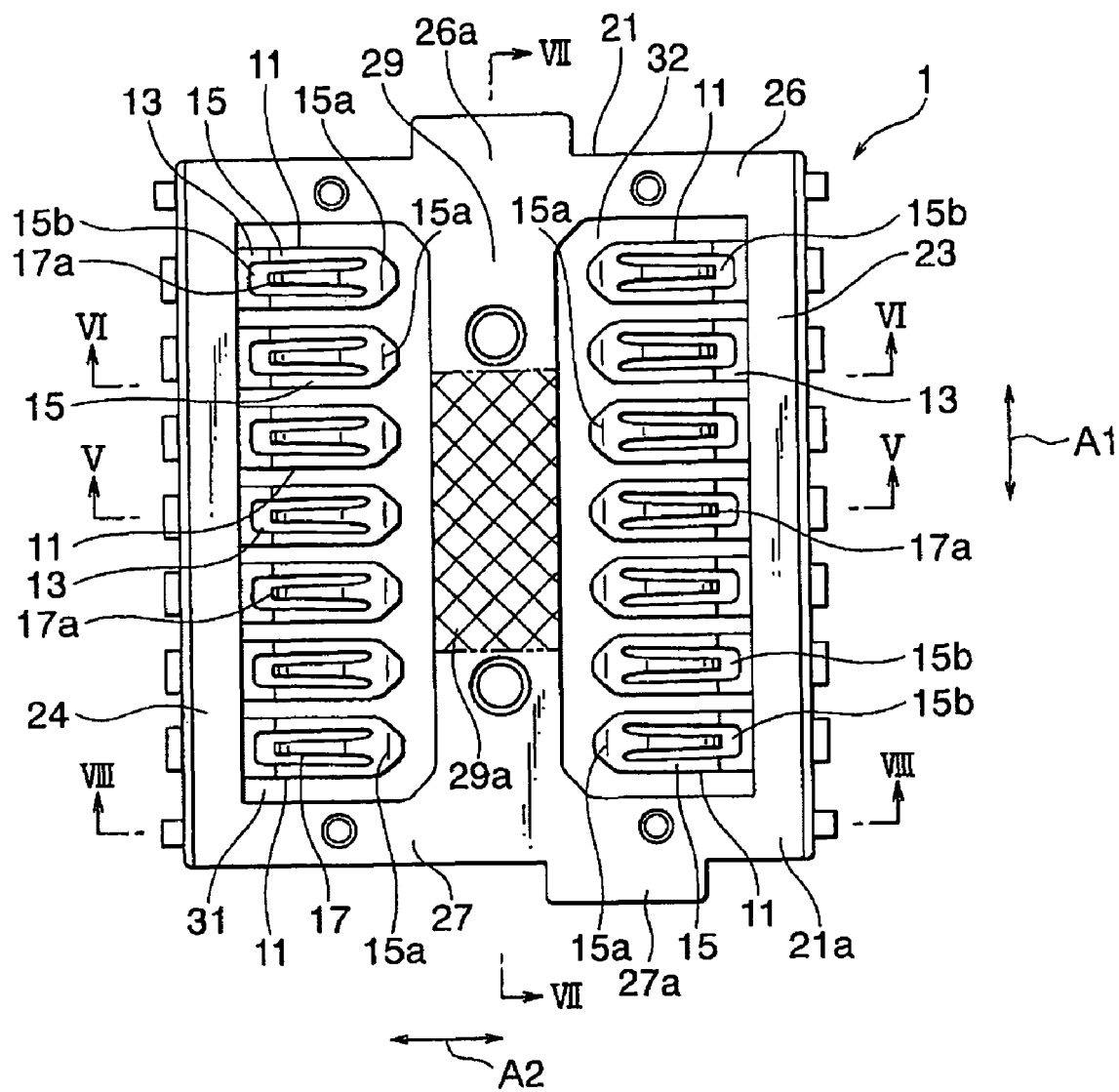
FIG. 1 is a plan view of a connector according to a first embodiment of this invention.

At first referring to FIGS. 1 through 20, description will be made of a connector according to a first embodiment of this invention.

The connector depicted at 1 in the figures comprises a plurality of conductive contacts 11 and an insulator 21 holding the contacts 11. The contacts 11 are arranged in two rows extending in a first direction A1 (up-and-down direction on a drawing sheet in FIG. 1) and faced to each other in a second direction A2 (transversal direction on the drawing sheet in FIG. 1) perpendicular to the first direction A1. In each row, the contacts 11, seven in number, are arranged in parallel with a space left from one another in the first direction A1.

Each contact 11 has a holding portion 13 (see FIGS. 4 and 5) held by the insulator 21, a first spring portion 15 extending from one side of the holding portion 13 in one direction, namely, sense or aspect, and a second spring portion 17 extending from an intermediate portion 15c of the first spring portion 15 in the other direction, namely, sense or aspect substantially opposite to the one direction. The first spring portion 15 has a first contacting portion 15a formed at its free end. The second spring portion 17 has a second contacting portion 17a formed at its free end. The first spring portion 15 has an opening portion 15b extending from the vicinity of the first contacting portion 15a towards the holding portion 13. The second spring portion 17 extends through the opening portion 15b towards the holding portion 13.

The first spring portion 15 is slightly bent towards one side of a predetermined plane along the drawing sheet of FIG. 1. As a result, the first contacting portion 15a protrudes from an upper surface of the insulator 21. The second spring portion 17 is slightly bent towards the other side of the predetermined plane. As a result, the second contacting portion 17a protrudes from a lower surface of the insulator 21.

Figure 2:
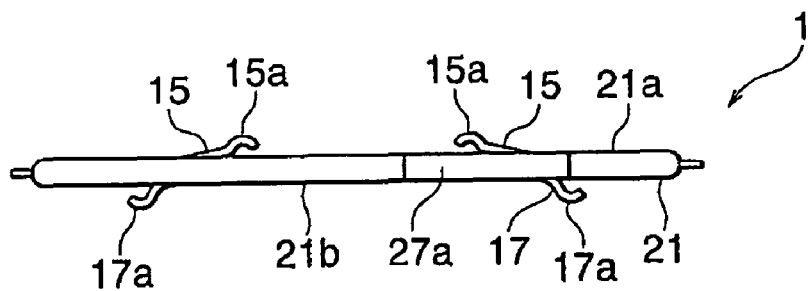
FIG. 2 is a front view of the connector illustrated in FIG. 1.
Figure 3:
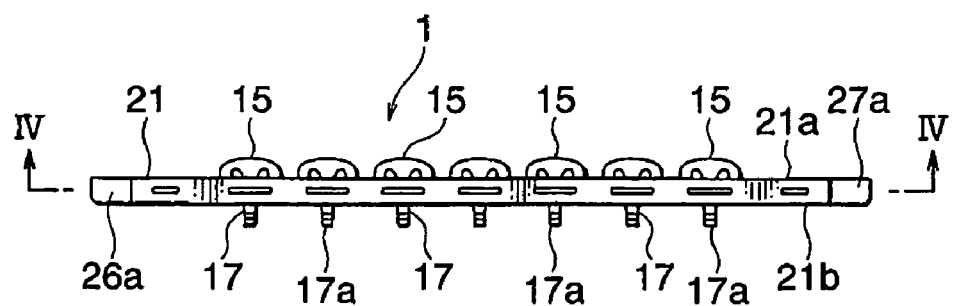
FIG. 3 is a side view of the connector illustrated in FIG. 1.
Figure 5:
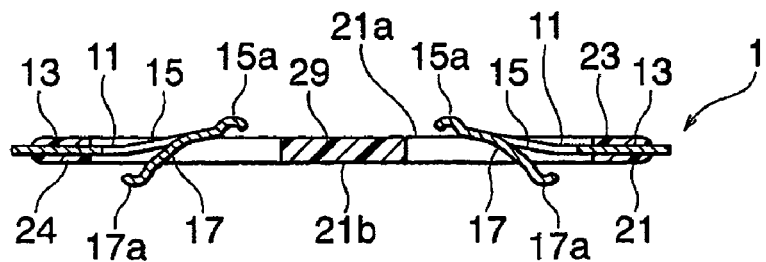
FIG. 5 is a sectional view taken along a line V-V in FIG. 1.
Figure 6:
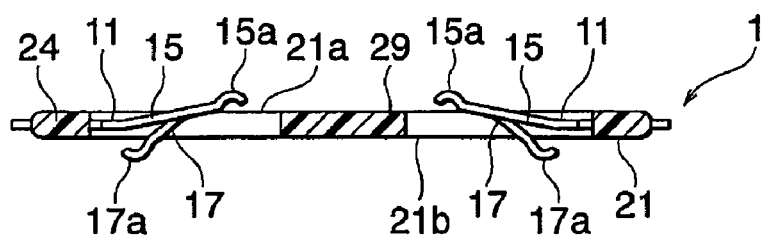
FIG. 6 is a sectional view taken along a line VI-VI in FIG. 1.
Figure 7:
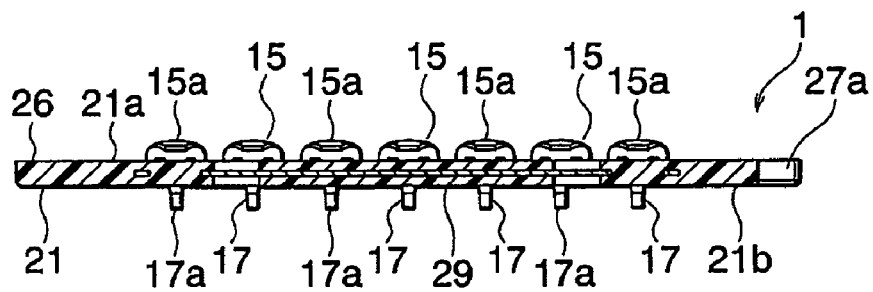
FIG. 7 is a sectional view taken along a line VII-VII in FIG. 1.
Figure 8:
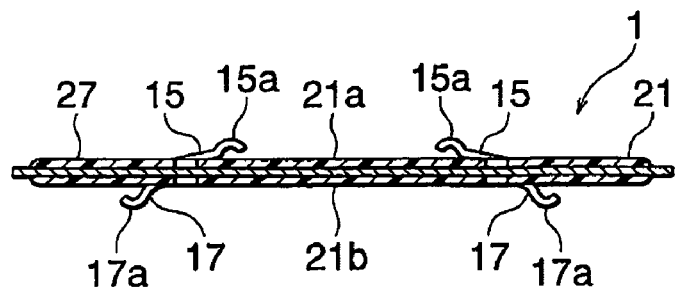
FIG. 8 is a sectional view taken along a line VIII-VIII in FIG. 1.

As illustrated in FIGS. 2, 5, and 6, the first contacting portion 15a is bent in an arcuate shape in a side view. Similarly, the second contacting portion 17a is bent in an arcuate shape.

Figure 4:
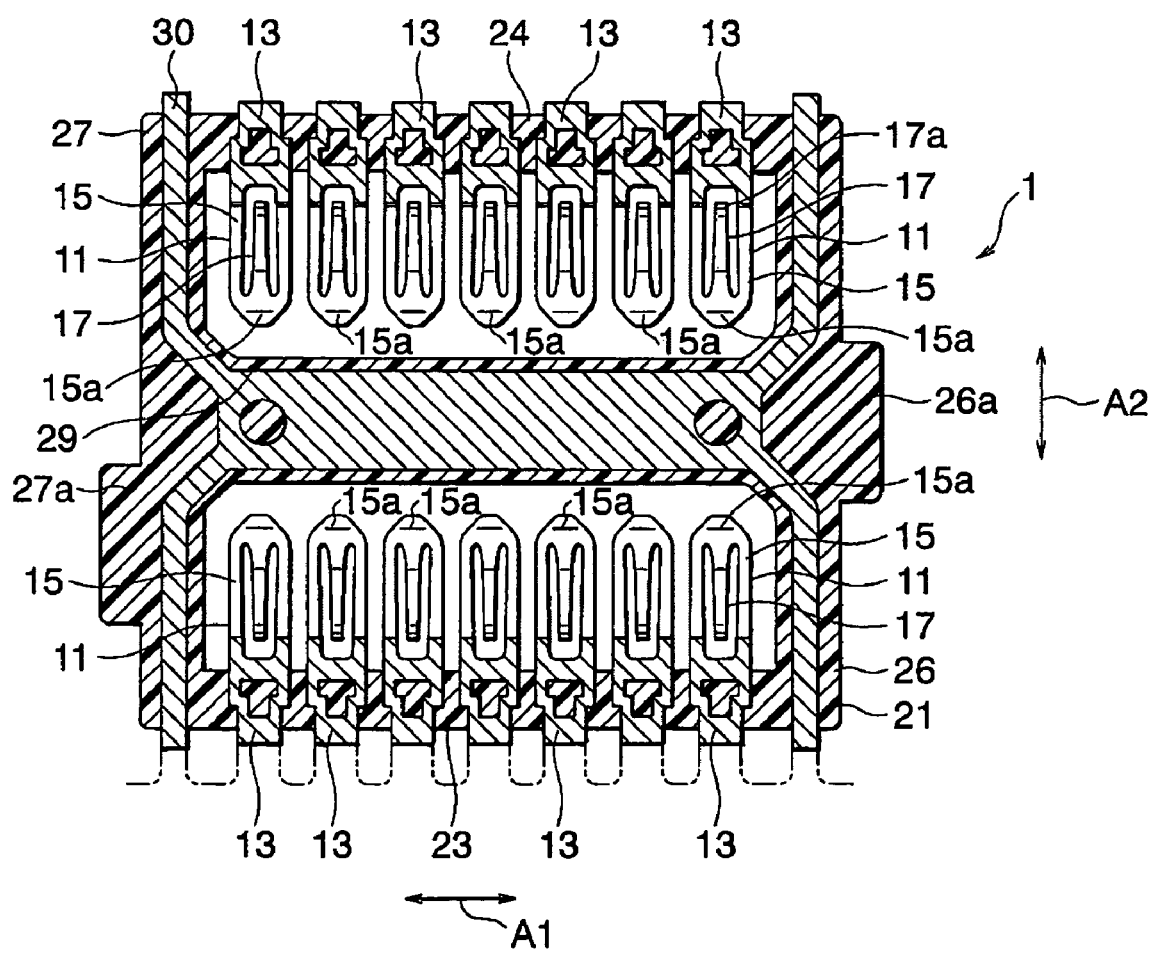
FIG. 4 is a sectional view taken along a line IV-IV in FIG. 3.

In FIG. 4, a reference numeral 30 represents a metal plate (strengthening plate) for strengthening the insulator 21. The metal plate 30 is held by the insulator 21 together with the contacts 11 when the insulator 21 is formed by molding.

Figure 9:
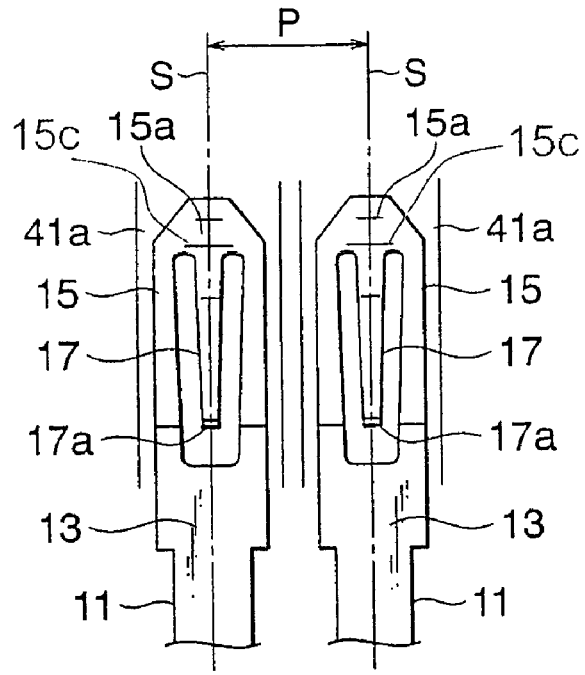
FIG. 9 is an enlarged plan view of a part of the contact illustrated in FIG. 1.
Figure 10:
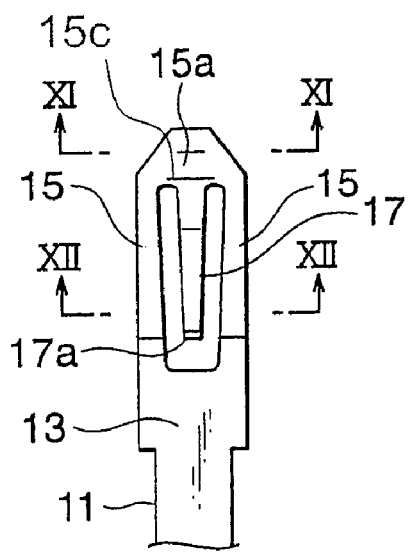
FIG. 10 is a plan view for describing the shapes of first and second contacting portions of the contact illustrated in FIG. 1.
Figure 11:
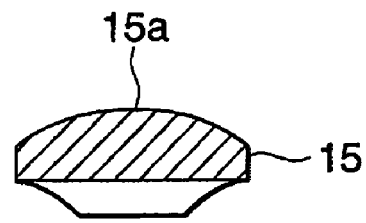
FIG. 11 is a sectional view taken along a line XI-XI in FIG. 10.
Figure 12:
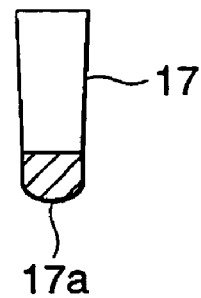
FIG. 12 is a sectional view taken along a line XII-XII in FIG. 10.

As illustrated in FIG. 9, the first and the second contacting portions 15a and 17a are located on a straight line S in a plan view. As illustrated in FIG. 11, the first contacting portion 15a has an arcuate section so that its surface protrudes outward. As illustrated in FIG. 12, the second contacting portion 17a has an arcuate section so that its surface protrudes outward. Thus, the surface of each of the first and the second contacting portions 15a and 17a is formed into an arcuate shape so that contacting force is entirely concentrated to a single point to assure stable electrical connection.

The above-mentioned contact 11 may be formed by punching a thin conductive plate using a press and thereafter bending the conductive plate. Upon punching the conductive plate using the press, it is possible to simultaneously form the shapes of the first and the second spring portions 15 and 17 and the opening portion 15b of the first spring portion 15 by punching.

The insulator 21 has a substantially rectangular plate-like shape and is formed by molding an insulating resin material. The insulator 21 has a pair of longitudinal frame portions 23 and 24 parallel to each other, a pair of transversal frame portions 26 and 27 connecting opposite ends of the longitudinal frame portions 23 and 24, and a center frame portion 29 having opposite ends connected to the transversal frame portions 26 and 27 and extending in parallel to the longitudinal frame portions 23 and 24 to equally divide a space between the longitudinal frame portions 23 and 24.

Between one longitudinal frame portion 23 and the center frame portion 29 and between the other longitudinal frame portion 24 and the center frame portion 29, a pair of receiving portions 31 and 32 are formed as large openings, respectively. In the receiving portions 31 and 32, the first and the second spring portions 15 and 17 of the contacts 11 are located.

The holding portions 13 of the contacts 11 are held by the longitudinal frame portions 23 and 24 when the insulator 21 is formed by insert-molding. The holding portions 13 of the contacts 11 are press-fitted into holes formed in the longitudinal frame portions 23 and 24. Alternatively, the holding portions 13 may be held by the longitudinal frame portions 23 and 24 by welding.

The first spring portions 15 extend from the receiving portions 31 and 32 to a position above one surface 21a of the insulator 21. The first contacting portions 15a are formed at a position farthest from the one surface 21a of the insulator 21. The second spring portions 17 extend from the receiving portions 31 and 32 to a position below the other surface 21b of the insulator 21. The second contacting portions 17a are formed at a position farthest from the other surface 21b of the insulator 21.

Further, one transversal frame portion 26 is provided with a first positioning portion 26a protruding from a part of a peripheral portion thereof outward in the first direction A1. The first positioning portion 26a is located at the center of the connector 1 in the second direction A2. The other transversal frame portion 27 is provided with a second positioning portion 27a protruding from a part of a peripheral portion thereof outward in the first direction A1. The second positioning portion 27a is slightly shifted from the center of the connector 1 in the second direction A2. The first and the second positioning portions 26a and 27a serve to locate the connector 1 at a predetermined position.

Figure 13:
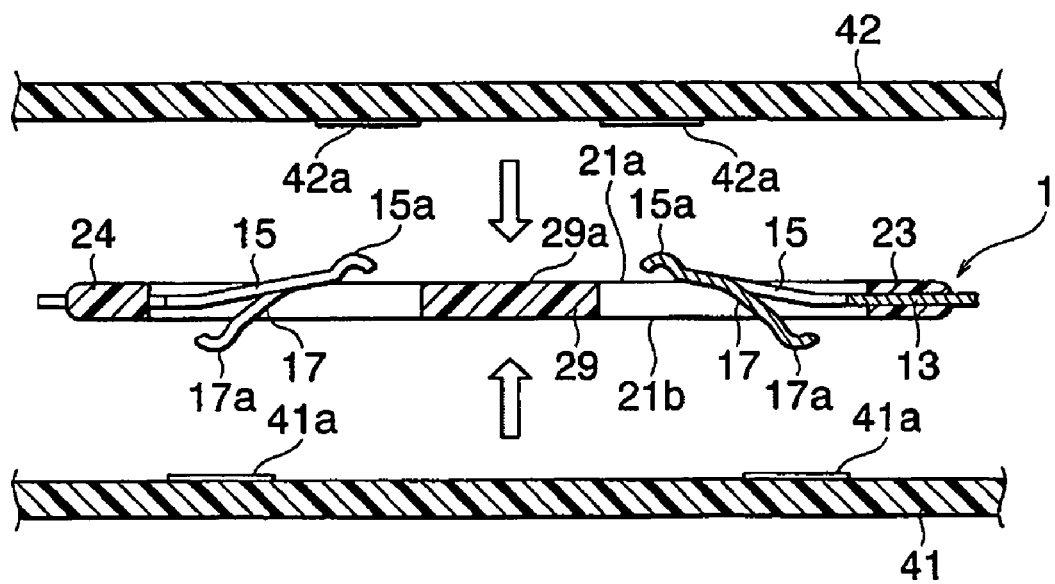
FIG. 13 is a sectional view showing a state before the connector illustrated in FIGS. 1 to 9 is mounted between boards.

The center frame portion 29 has one surface flush with the one surface 21a of the insulator 21 and provided with a flat sucked surface 29a. The sucked surface 29a has a sufficiently wide area so that the connector 1 is sucked and transported by a sucking portion (not shown) of an automatic mounting machine. In FIG. 1, the sucked surface 29a is depicted by a mesh pattern. The sucked surface 29a is used when the connector 1 for connecting two printed boards 41 and 42 as two connection objects faced to each other as shown in FIG. 13 is mounted to one printed board 41. On at least one surface of the printed board 41, a circuit pattern (not shown) and conductive lands 41a as conductive portions connected to the circuit pattern are formed. Likewise, on at least one surface of the printed board 42, a circuit pattern (not shown) and conductive lands 42a as conductive portions connected to the circuit pattern are formed. The lands 41a and 42a are positioned in correspondence to the straight line S in FIG. 9. Therefore, the pitch P between the contacts 11 can be narrowed.

Figure 14:
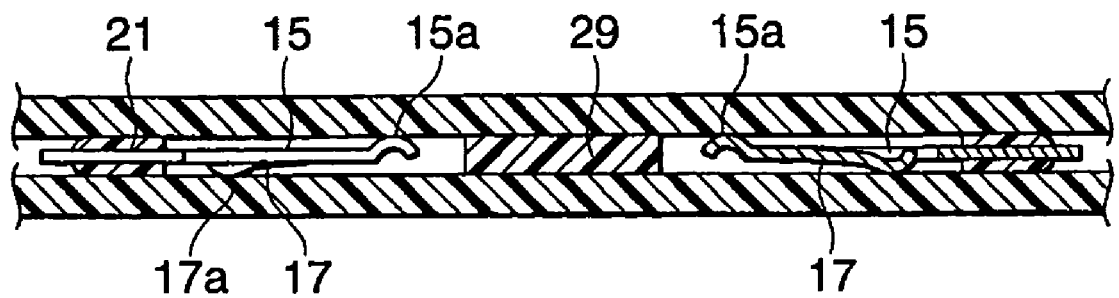
FIG. 14 is a sectional view showing a state where the connector illustrated in FIGS. 1 to 9 is mounted between the boards.

Now, description will be made of a method of mounting the connector 1. In the state where the sucked surface 29a is sucked by the sucking portion of the automatic mounting machine, the connector 1 is transported to a position above the one printed board 41. After the second contacting portions 17a are positioned at the lands 41a as illustrated in FIG. 13, the connector 1 is mounted to the one printed board 41. Next, after the lands 42a of the other printed board 42 are positioned at the first contacting portions 15a, the connector 1 is sandwiched between the printed boards 41 and 42 and fixed to the printed boards 41 and 42 as illustrated in FIG. 14.

When the connector 1 is fixed to the printed boards 41 and 42 in the above-mentioned manner, the first contacting portions 15a are elastically contacted with the lands 42a while the second contacting portions 17a are elastically contacted with the lands 41a. At this time, the first and the second spring portions 15 and 17 are changed in inclination angle following the displacement of the first and the second contacting portions 15a and 17a. Since the surfaces of the first and the second contacting portions 15a and 17a as contacting surfaces have an arcuate shape in section and are therefore brought into point contact with the lands 41a and 42a.

As described above, the lands 41a and 42a of a planar shape sandwich the contacts 11 on opposite sides thereof to be brought into contact with the first and the second contacting portions 15a and 17a of an arcuate shape protruding from the upper and the lower surfaces of the insulator 21. Therefore, in the state where the printed boards 41 and 42 are brought into contact with the opposite surfaces (the other and the one surfaces 21b and the 21a) of the insulator 21, sufficient contacting force is produced between the first and the second contacting portions 15a and 17a and the lands 42a and 41a so that stable electrical connection is achieved between the circuit patterns of the printed boards 41 and 42. Thus, when the connector 1 is sandwiched and held between the printed boards 41 and 42, an electrical signal can be transmitted and received between the printed boards 41 and 42 through the first and the second contacting portions 15a and 17a and the first and the second spring portions 15 and 17.

As will be understood from FIG. 9, the first and the second contacting portions 15a and 17a extending along the single straight line S in each single contact 11 straightly extend with respect to the lands 41a and 42a. Since the first and the second contacting portions 15a and 17a are located on the single straight line S as mentioned above, the pitch P between the contacts 11 can be narrowed. Therefore, the size of the connector 1 can be reduced in the first direction A1. In addition, the width and the pitch of the lands 41a and 42a can be narrowed. The printed boards 41 and 42 are easy to design because the lands 41a and 42a may have the same size and may be formed at the same positions.

Figure 15:
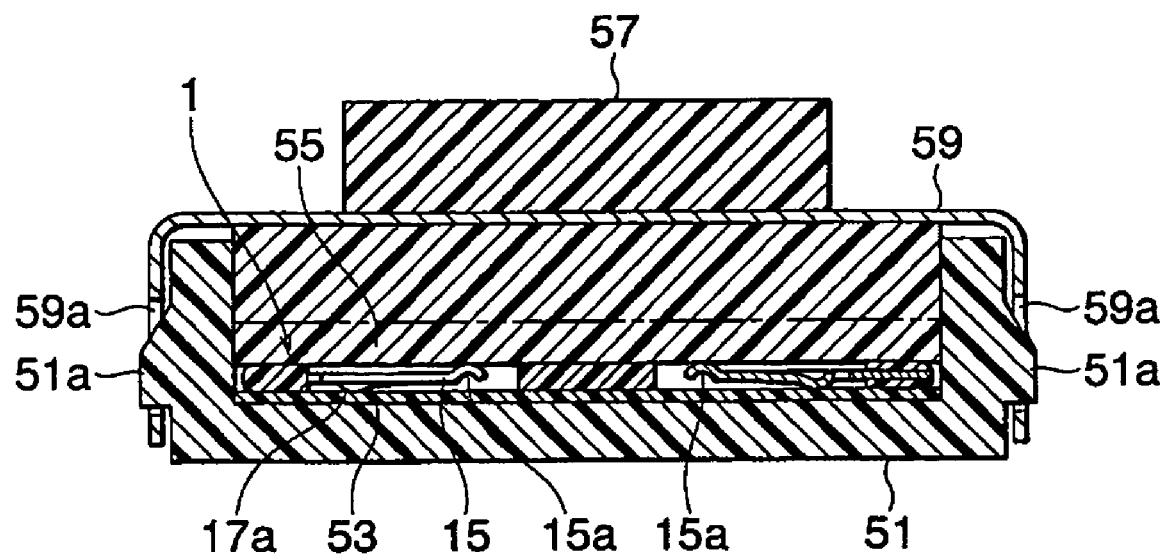
FIG. 15 is a sectional view showing an example in which the connector illustrated in FIG. 1 is used in a mobile telephone camera.

FIG. 15 shows a camera assembly in which the above-mentioned connector is used in a camera mounted to a mobile telephone.

Referring to FIG. 15, the camera assembly comprises a case 51, a FPC (Flexible Printed Circuit) 53 as a connection object disposed in the case 51, the connector 1 placed on the FPC 53, a printed board 55 as another connection object disposed on the connector 1, a camera 57 mounted on the printed board 55, and a cover member 59 covering the case 51. The cover member 59 has a plurality of hole-like engaged portions 59a engaged with a plurality of engaging portions 51a formed on a pair of outer side surfaces of the case 51 in one-to-one correspondence.

Referring to FIGS. 16 to 20 in addition, description will hereinafter be made of an assembling process of the camera assembly.

Figure 16:
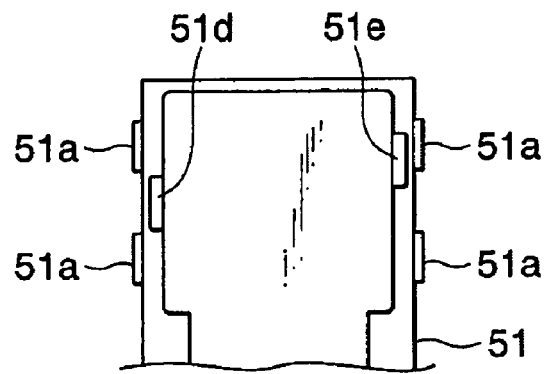
FIG. 16 is a plan view of a case illustrated in FIG. 15.

As illustrated in FIG. 16, the case 51 is opened on its upper surface. The case 51 has an inner wall surface provided with first and second positioning recesses 51d and 51e to be fitted over the first and the second positioning portions 26a and 27a formed on the insulator 21 so as to position the connector 1 on the predetermined plane in the case 51.

Figure 17:
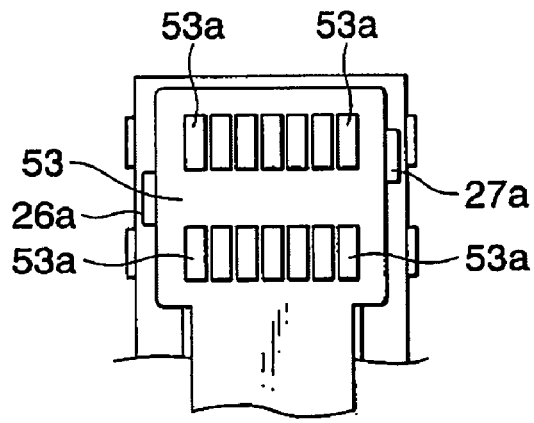
FIG. 17 is a plan view showing a state where a FPC is attached to the case illustrated in FIG. 16.

At first referring to FIG. 17, a forward end portion of the FPC 53 is received in the case 51. On one surface of the forward end portion of the FPC 53, a plurality of lands 53a to be contacted with the second contacting portions 17a of the connector 1 are exposed. The lands 53a are equal in number to the contacts 11. The lands 53a are similar to the lands 41a and 42a described in connection with FIGS. 9 and 13. The FPC 53 extending outward from the inside of the case 51 has a rear end connected to an electronic component (not shown) in a main body of the mobile telephone.

Figure 18:
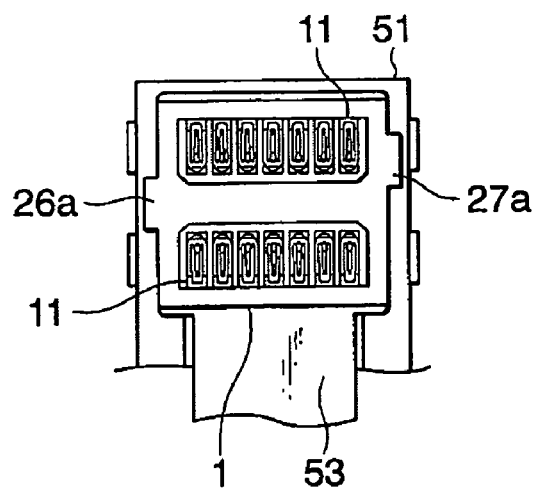
FIG. 18 is a plan view showing a state where the connector is arranged on the FPC illustrated in FIG. 17.

Next referring to FIG. 18, the connector 1 is placed on the FPC 53. At this time, the first and the second positioning portions 26a and 27a formed on the insulator 21 are fitted to the first and the second positioning recesses 51d and 51e formed on the case 51 so that the connector 1 is positioned on the predetermined plane within the case 51.

Figure 19:
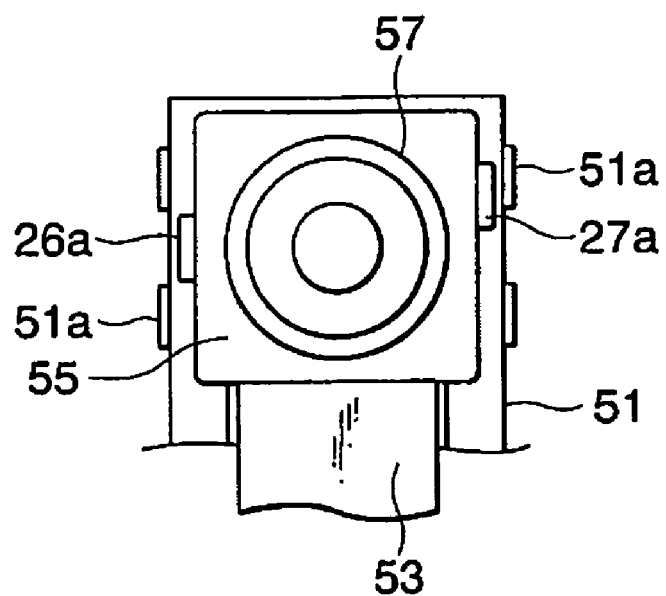
FIG. 19 is a plan view showing a state where the camera is arranged on the connector illustrated in FIG. 18.

Thereafter, as illustrated in FIG. 19, the printed board 55 disposed on a rear side of the camera 57 is placed on the connector 1 together with the camera 57. At this time, the printed board 55 is fitted in a frame of the case 51 so that the first contacting portions 15a are reliably contacted with lands (not shown) formed on the printed board 55. The lands are similar to the lands 41a and 42a described in connection with FIGS. 9 and 13.

Figure 20:
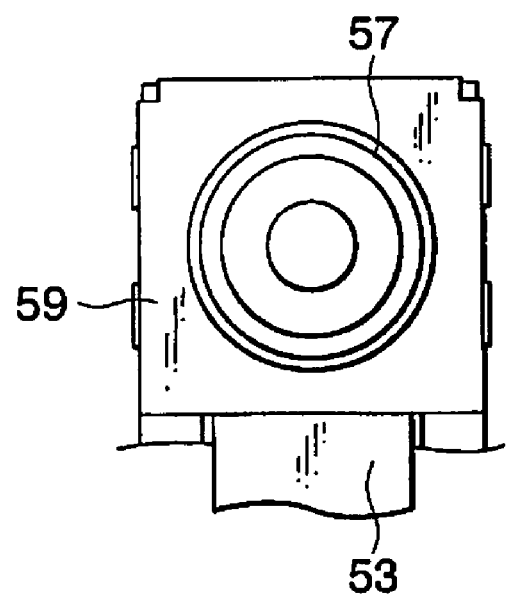
FIG. 20 is a plan view showing a state where the camera illustrated in FIG. 19 is held by a cover member.

Further, as illustrated in FIG. 20, the cover member 59 is put on the printed board 55 and pushed towards the case 51 to engage the engaging recesses 59a of the cover member 59 with the engaging portions 51a of the case 51. As a result, three components including the FPC 53, the connector 1, and the printed board 55 are continuously pressed and clamped between the case 51 and the cover member 51 to be fixed.

Figure 21:
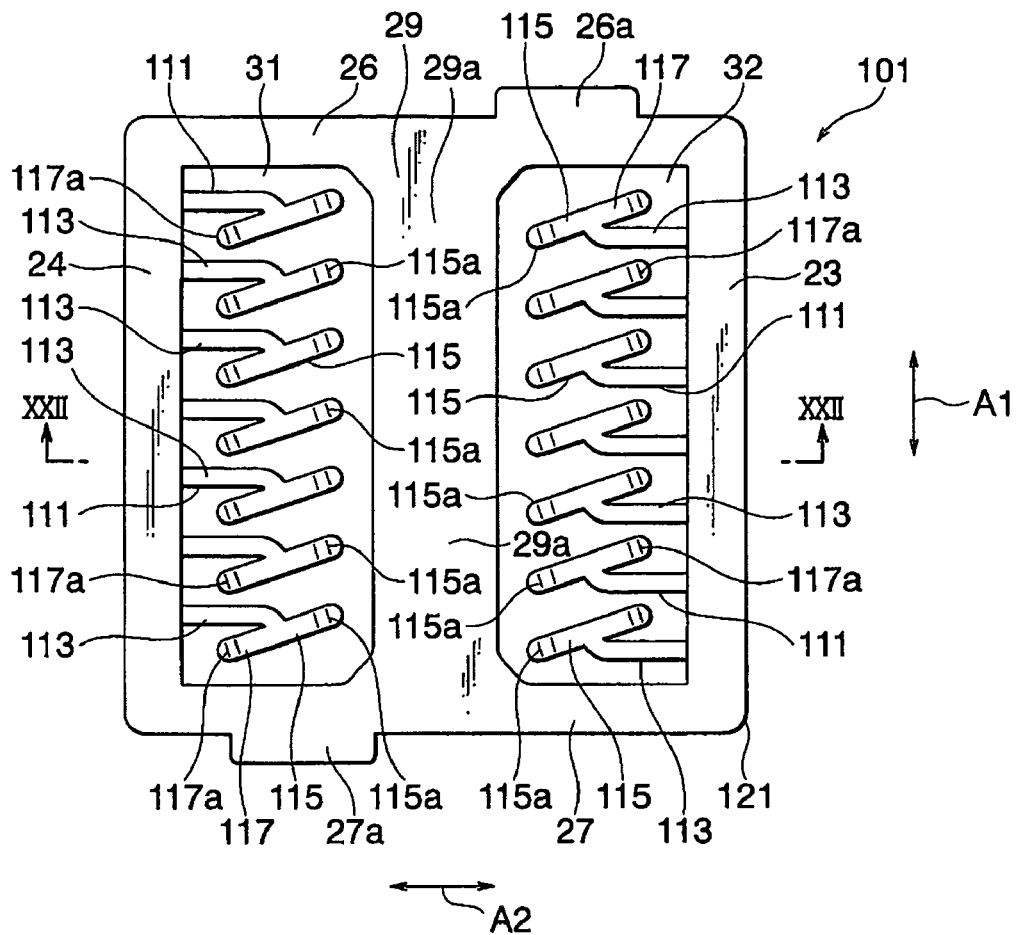
FIG. 21 is a plan view of a connector according to a second embodiment of this invention.
Figure 22A:
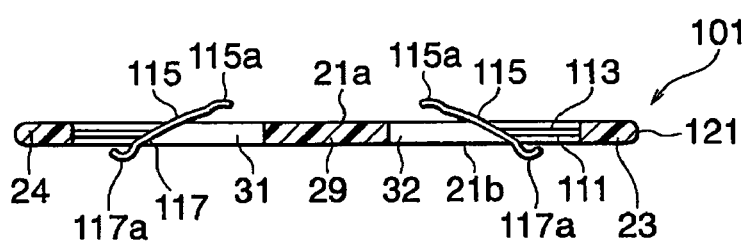
FIG. 22A is a sectional view taken along a line XXII-XXII in FIG. 21.

Referring to FIGS. 21 and 22A, a connector according to a second embodiment of this invention will be described. Similar parts are designated by like reference numerals and description thereof will be omitted.

The connector depicted at 101 in the figures comprises a plurality of conductive contacts 111 and an insulator 121 holding the contacts 111. The contacts 111 are arranged in two rows extending in a first direction A1 (up-and-down direction on a drawing sheet in FIG. 21) and faced to each other in a second direction A2 (transversal direction on the drawing sheet in FIG. 1) perpendicular to the first direction A1. In each row, the contacts 111, seven in number, are arranged in parallel with a space left from one another in the first direction A1.

Each contact 111 has a holding portion 113 held by the insulator 121 and extending in the second direction A2, a first spring portion 115 extending from an extending end of the holding portion 113 in the one direction, and a second spring portion 117. In the other direction, the second spring portion 117 extends from an intermediate portion of the first spring portion 115. In other words, the second spring portion 117 extends from the extending end of the holding portion 113. Herein, the one and the other directions are opposite to each other and intersect with the first and the second directions A1 and A2. Thus, as seen from FIG. 21, the first and the second spring portions 115 and 117 are inclined with respect to the holding portion 113 in a plan view of the contact 111.

The first spring portion 115 is slightly bent towards one surface 21a of the insulator 121. The second spring portion 117 is slightly bent towards the other surface 21b of the insulator 121. The first spring portion 115 has a first contacting portion 115a formed at its free end. The second spring portion 117 has a second contacting portion 117a formed at its free end.

The first contacting portion 115a has a surface with an arcuate section, like the first contacting portion 15a shown in FIG. 11. The second contacting portion 117a has a surface with an arcuate section, like the second contacting portion 17a shown in FIG. 12. As a result, each of the first and the second contacting portions 115a and 117a receives contacting force concentrated to a single point so that stable electrical connection is assured.

The above-mentioned contact 111 may be formed by punching a thin conductive plate using a press and thereafter bending the conductive plate.

The insulator 121 has a substantially rectangular plate-like shape and is formed by molding an insulating resin material. The insulator 121 has a pair of longitudinal frame portions 23 and 24 parallel to each other, a pair of transversal frame portions 26 and 27 connecting opposite ends of the longitudinal frame portions 23 and 24, and a center frame portion 29 having opposite ends connected to the transversal frame portions 26 and 27 and extending in parallel to the longitudinal frame portions 23 and 24 to equally divide a space between the longitudinal frame portions 23 and 24.

Between one longitudinal frame portion 23 and the center frame portion 29 and between the other longitudinal frame portion 24 and the center frame portion 29, a pair of receiving portions 31 and 32 are formed as large openings, respectively. In the receiving portions 31 and 32, the first and the second spring portions 115 and 117 of the contacts 111 are located.

The holding portions 113 of the contacts 111 are held by the longitudinal frame portions 23 and 24 when the insulator 121 is formed by insert-molding. The holding portions 113 of the contacts 111 may be held by the longitudinal frame portions 23 and 24 in other manners, for example, by forming holes in the longitudinal frame portions 23 and 24 and press-fitting the holding portions 113 into the holes or by welding the holding portions 113 to the longitudinal frame portions 23 and 24.

The first spring portions 115 extend from the receiving portions 31 and 32 to a position above the one surface 21a of the insulator 121. The first contacting portions 115a are formed at a position farthest from the one surface 21a of the insulator 121. The second spring portions 117 extend from the receiving portions 31 and 32 to a position below the other surface 21b of the insulator 121. The second contacting portions 117a are formed at a position farthest from the other surface 21b of the insulator 121.

Further, one transversal frame portion 26 is provided with a first positioning portion 26a protruding from a part of a peripheral portion thereof outward in the first direction A1. The first positioning portion 26a is slightly shifted from the center of the connector 101 in the second direction A2. The other transversal frame portion 27 is provided with a second positioning portion 27a protruding from a part of a peripheral portion thereof outward in the first direction A1. The second positioning portion 27a is slightly shifted from the center of the connector 101 in the second direction A2. The first and the second positioning portions 26a and 27a serve to locate the connector 101 at a predetermined position.

The center frame portion 29 has one surface flush with the one surface 21a of the insulator 121 and provided with a flat sucked surface 29a. The sucked surface 29a has a sufficiently wide area for sucking so that the connector 101 is sucked and transported by a sucking portion (not shown) of an automatic mounting machine. In FIG. 1, the sucked surface 29a is depicted by a mesh pattern. The sucked surface 29a is used when the connector 101 for connecting two printed boards 41 and 42 as two connection objects faced to each other as shown in FIG. 13 is mounted to one printed board 41.

Now, description will be made of a method of mounting the connector 101. In the state where the sucked surface 29a is sucked by the sucking portion of the automatic mounting machine, the connector 101 is transported to a position above the one printed board 41. After the second contacting portions 117a are positioned at the lands 41a, the connector 101 is mounted to the one printed board 41. Next, after the lands 42a of the other printed board 42 are positioned at the first contacting portions 115a, the connector 101 is sandwiched between the printed boards 41 and 42 and fixed to the printed boards 41 and 42 as illustrated in FIG. 14.

When the connector 101 is fixed to the printed boards 41 and 42 in the above-mentioned manner, the first contacting portions 115a are elastically contacted with the lands 42a while the second contacting portions 117a are elastically contacted with the lands 41a. At this time, the first and the second spring portions 115 and 117 are changed in inclination angle following the displacement of the first and the second contacting portions 115a and 117a. Since the surfaces of the first and the second contacting portions 115a and 117a as contacting surfaces have an arcuate shape in section and are therefore brought into point contact with the lands 41a and 42a.

Figure 22B:
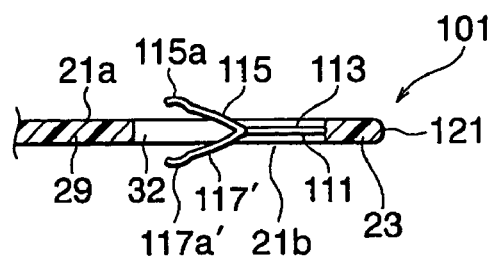
FIG. 22B is a sectional view showing a modification where a second spring portion illustrated in FIG. 22A is changed in position.

FIG. 22B shows a modification in which the second spring portion 117 illustrated in FIGS. 21 and 22A is replaced by a second spring portion 117' changed in position. In the connector 101 illustrated in FIG. 22B, the second spring portion 117' is folded back and extends from the extending end of the holding portion 113 in a direction same as an extending direction of the first spring portion 115. Specifically, the first and the second spring portions 115 and 117' extend from the holding portion 113 in the same direction and are inclined to be separated from each other in a thickness direction of the connector 101. The first contacting portion 115a of the first spring portion 115 and a second contacting portion 117a' of the second spring portion 117' are faced to each other in the thickness direction with a space left therebetween.

A specific example where the connector 101 is used in the camera assembly illustrated in FIG. 15 is similar to that described in connection with the connector 1 and the description thereof will be omitted.

Figure 23:
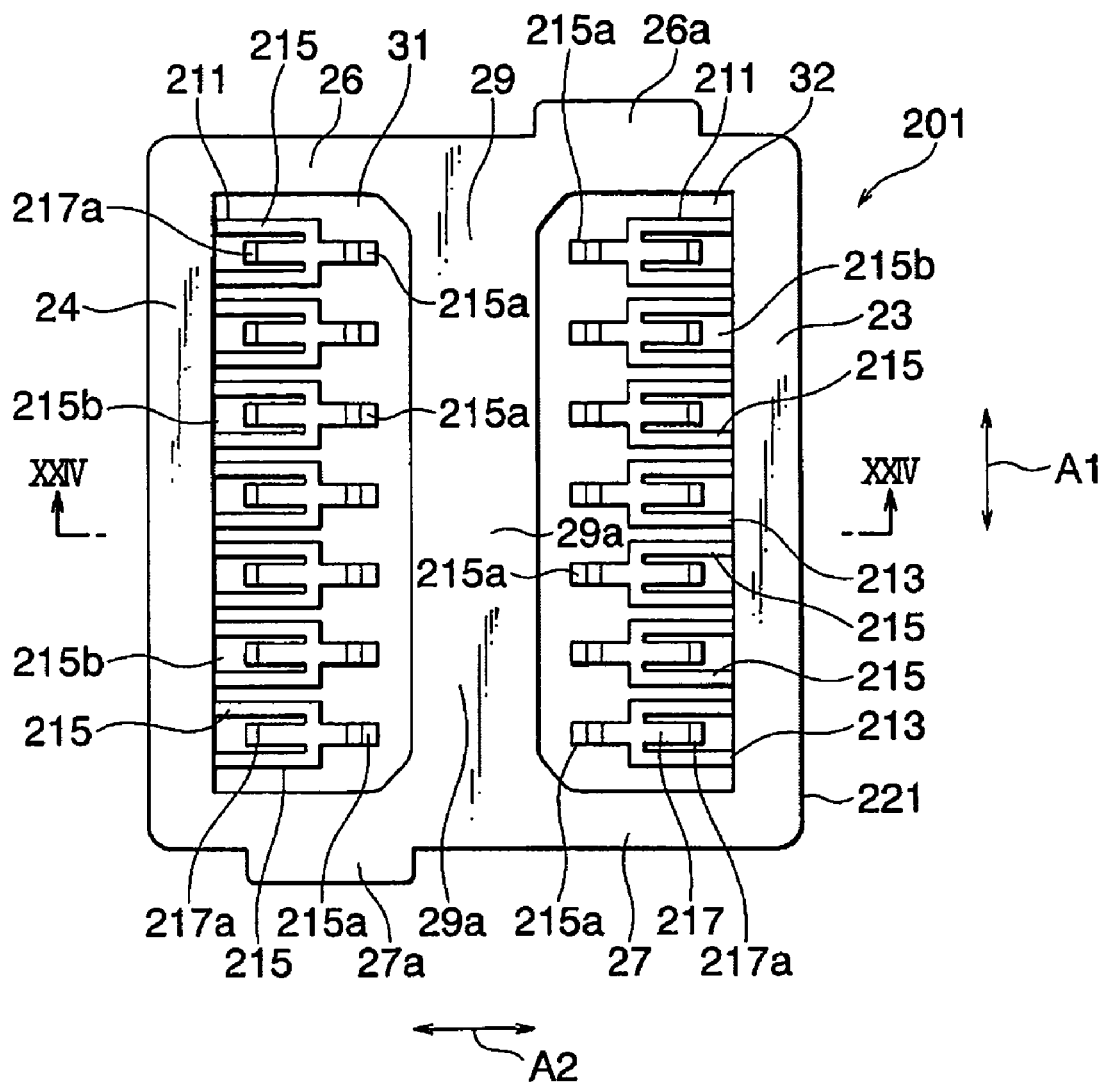
FIG. 23 is a plan view of a connector according to a third embodiment of this invention.
Figure 24:
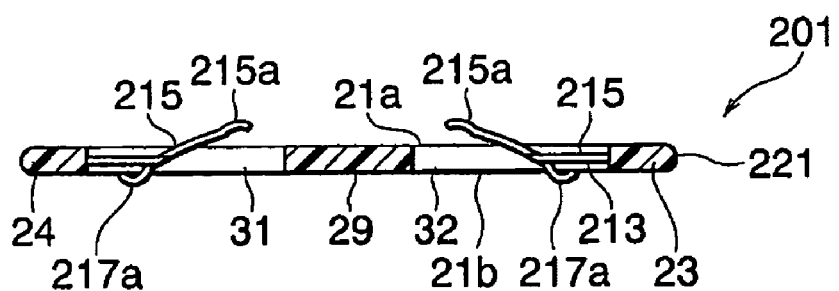
FIG. 24 is a sectional view taken along a line XXIV-XXIV in FIG. 23.

Referring to FIGS. 23 and 24, a connector according to a third embodiment of this invention will be described. Similar parts are designated by like reference numerals and description thereof will be omitted.

The connector depicted at 201 in the figures comprises a plurality of conductive contacts 211 and an insulator 221 holding the contacts 211. The insulator 221 is similar in shape to the insulator 121 of the connector 101 and, therefore, description thereof will be omitted.

Each contact 211 has a holding portion 213 held by the insulator 221, a first spring portion 215 extending from the holding portion 213 in one direction, and a second spring portion 217 extending from an intermediate portion of the first spring portion 215 in the other direction. The first spring portion 215 has an opening portion 215b near the holding portion 213. The second spring portion 217 extends through the opening portion 215b towards the holding portion 213. Thus, the second spring portion 217 extends from the intermediate portion of the first spring portion 215 in a direction opposite to an extending direction of the first spring portion 215.

The first spring portion 215 is slightly bent towards one surface 21a of the insulator 221. The second spring portion 217 is slightly bent towards the other surface 21b of the insulator 221. The first spring portion 215 has a first contacting portion 215a formed at its free end. The second spring portion 217 has a second contacting portion 217a formed at its free end. The first and the second contacting portions 215a and 217a are located on a straight line S in a plan view.

The first contacting portion 215a has a surface with an arcuate section, like the first contacting portion 15a shown in FIG. 11. The second contacting portion 217a has a surface with an arcuate section, like the second contacting portion 17a shown in FIG. 12. As a result, each of the first and the second contacting portions 215a and 217a receives contacting force concentrated to a single point so that stable electrical connection is assured.

The above-mentioned contact 211 may be formed by punching a thin conductive plate using a press and thereafter bending the conductive plate. Upon punching the conductive plate using the press, it is possible to simultaneously form the shapes of the first and the second spring portions 215 and 217 and the opening portion 215b of the first spring portion 215 by punching.

In receiving portions 31 and 32 of the insulator 221, the first and the second spring portions 215 and 217 of the contacts 211 are located. The holding portions 213 of the contacts 211 are held by longitudinal frame portions 23 and 24 when the insulator 221 is formed by insert-molding.

The holding portions 213 of the contacts 211 are press-fitted into holes formed in the longitudinal frame portions 23 and 24. Alternatively, the holding portions 213 may be held by the longitudinal frame portions 23 and 24 by welding.

The first spring portions 215 extend from the receiving portions 31 and 32 to a position above one surface 21a of the insulator 221. The first contacting portions 215a are formed at a position farthest from the one surface 21a of the insulator 221. The second spring portions 217 extend from the receiving portions 31 and 32 to a position below the other surface 21b of the insulator 221. The second contacting portions 217a are formed at a position farthest from the other surface 21b of the insulator 221.

When two printed boards 41 and 42 as two connection objects faced to each other as shown in FIG. 13 are connected by the connector 201, a sucked surface 29a of the connector 201 is sucked by a sucking portion of an automatic mounting machine. In this state, the connector 201 is transported to a position above the one printed board 41. After the second contacting portions 217a are positioned at the lands 41a, the connector 201 is mounted to the one printed board 41. Next, after the lands 42a of the other printed board 42 are positioned at the first contacting portions 215a, the connector 201 is sandwiched between the printed boards 41 and 42 and fixed to the printed boards 41 and 42 as illustrated in FIG. 14.

When the connector 201 is fixed to the printed boards 41 and 42 in the above-mentioned manner, the first contacting portions 215a are elastically contacted with the lands 42a while the second contacting portions 217a are elastically contacted with the lands 41a. At this time, the first and the second spring portions 215 and 217 are changed in inclination angle following the displacement of the first and the second contacting portions 215a and 217a. Since the surfaces of the first and the second contacting portions 215a and 217a as contacting surfaces have an arcuate shape in section and are therefore brought into point contact with the lands 41a and 42a.

A specific example where the connector 201 is used in the camera assembly illustrated in FIG. 15 is similar to that described in connection with the connector 1 and the description thereof will be omitted.

Figure 25:
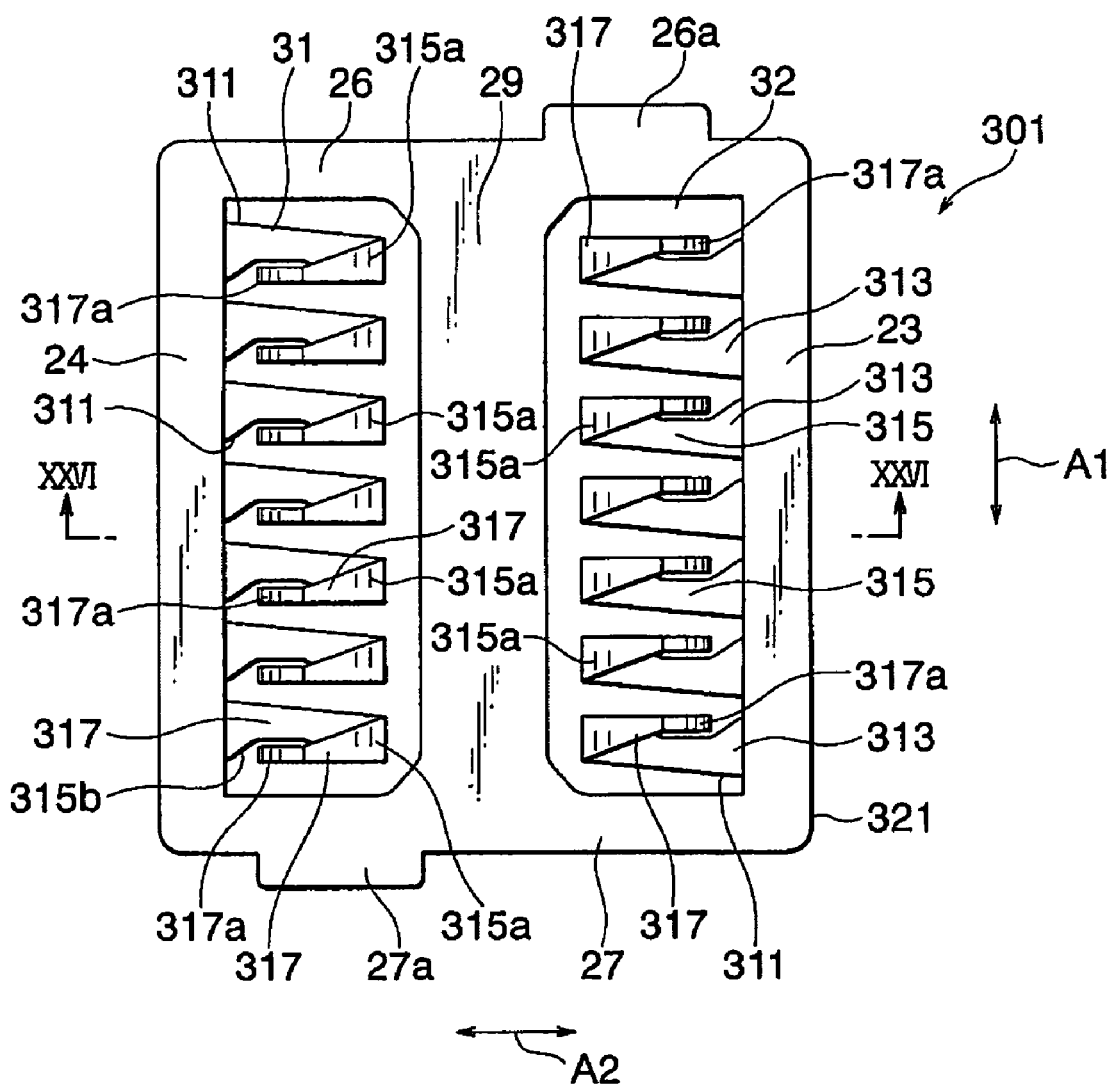
FIG. 25 is a plan view of a connector according to a fourth embodiment of this invention.
Figure 26:
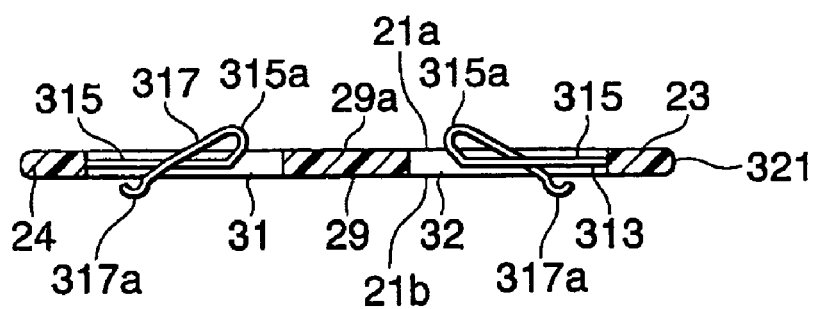
FIG. 26 is a sectional view taken along a line XXVI-XXVI in FIG. 25.

Referring to FIGS. 25 and 26, a connector according to a fourth embodiment of this invention will be described. Similar parts are designated by like reference numerals and description thereof will be omitted.

The connector depicted at 301 in the figures comprises a plurality of conductive contacts 311 and an insulator 321 holding the contacts 311. The insulator 321 is similar in shape to the insulator 221 of the connector 201 and, therefore, description thereof will be omitted.

Each contact 311 has a holding portion 313 held by the insulator 321, a first spring portion 315 extending from the holding portion 313 in one direction, and a second spring portion 317 folded back from an extending end of the first spring portion 315 and extending in the other direction. Thus, the second spring portion 317 is folded back from a forward end of the first spring portion 315 and extends in a direction opposite to an extending direction of the first spring portion 315. The first spring portion 315 has a cutout portion 315b. The second spring portion 317 extends through the cutout portion 315 and intersects with the first spring portion 315.

The first spring portion 315 protrudes above one surface 21a of the insulator 321 and a first contacting portion 315a is formed at a protruding part thereof. The second spring portion 317 protrudes below the other surface 21b of the insulator 321 and a second contacting portion 317a is formed at a protruding part thereof. The first and the second contacting portions 315a and 317a are located on a straight line in a plan view.

The first contacting portion 315a has a surface with an arcuate section, like the first contacting portion 15a shown in FIG. 11. The second contacting portion 317a has a surface with an arcuate section, like the second contacting portion 17a shown in FIG. 12. As a result, each of the first and the second contacting portions 315a and 317a receives contacting force concentrated to a single point so that stable electrical connection is assured.

The above-mentioned contact 311 may be formed by punching a thin conductive plate using a press and thereafter bending the conductive plate. Upon punching the conductive plate using the press, it is possible to simultaneously form the shapes of the first and the second spring portions 315 and 317 and an opening portion 315b of the first spring portion 315 by punching.

In receiving portions 31 and 32 of the insulator 321, the first and the second spring portions 315 and 317 of the contacts 311 are located. The holding portions 313 of the contacts 311 are held by longitudinal frame portions 23 and 24 when the insulator 321 is formed by insert-molding.

The holding portions 313 of the contacts 311 are press-fitted into holes formed in the longitudinal frame portions 23 and 24. Alternatively, the holding portions 313 may be held by the longitudinal frame portions 23 and 24 by welding.

The first spring portions 315 extend from the receiving portions 31 and 32 to a position above one surface 21a of the insulator 321. The first contacting portions 315a are formed at a position farthest from the one surface 21a of the insulator 321. The second spring portions 317 extend from the receiving portions 31 and 32 to a position below the other surface 21b of the insulator 321. The second contacting portions 317a are formed at a position farthest from the other surface 21b of the insulator 321.

When two printed boards 41 and 42 as two connection objects faced to each other as shown in FIG. 13 are connected by the connector 301, a sucked surface 29a of the connector 301 is sucked by a sucking portion of an automatic mounting machine. In this state, the connector 301 is transported to a position above the one printed board 41. After the second contacting portions 317a are positioned at the lands 41a, the connector 301 is mounted to the one printed board 41. Next, after the lands 42a of the other printed board 42 are positioned at the first contacting portions 315a, the connector 301 is sandwiched between the printed boards 41 and 42 and fixed to the printed boards 41 and 42 as illustrated in FIG. 14.

When the connector 301 is fixed to the printed boards 41 and 42 in the above-mentioned manner, the first contacting portions 315a are elastically contacted with the lands 42a while the second contacting portions 317a are elastically contacted with the lands 41a. At this time, the first and the second spring portions 315 and 317 are changed in inclination angle following the displacement of the first and the second contacting portions 315a and 317a. Since the surfaces of the first and the second contacting portions 315a and 317a as contacting surfaces have an arcuate shape in section and are therefore brought into point contact with the lands 41a and 42a.

A specific example where the connector 301 is used in the camera assembly illustrated in FIG. 15 is similar to that described in connection with the connector 1 and the description thereof will be omitted.

Figure 27:
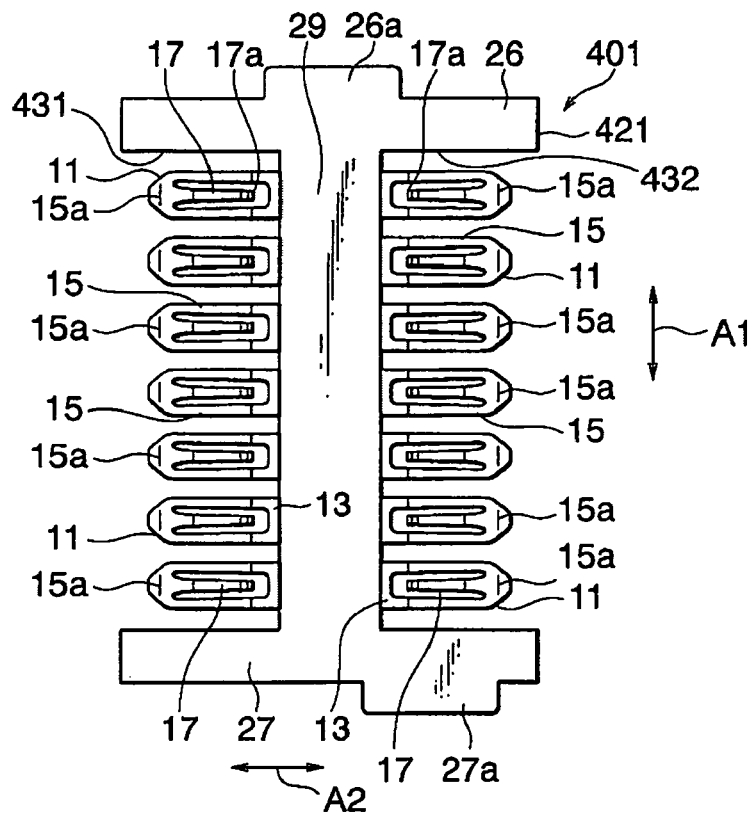
FIG. 27 is a plan view of a connector according to a fifth embodiment of this invention.

Referring to FIG. 27, a connector according to a fifth embodiment of this invention will be described. Similar parts are designated by like reference numerals and description thereof will be omitted.

The connector depicted at 401 in the figure comprises a plurality of conductive contacts 11 and an insulator 421 holding the contacts 11. Each contact 11 is similar in shape to the contact 11 described above.

The insulator 421 is formed by molding an insulating resin material. The insulator 421 has a pair of transversal frame portions 26 and 27 parallel to each other and a center frame portion 29 having opposite ends connected to longitudinal center portions of the transversal frame portions 26 and 27, respectively. Thus, the insulator 421 has a shape such that the longitudinal frame portions 23 and 24 are removed from the insulator 21 illustrated in FIG. 1.

On both sides of the center frame portion 29, a pair of large receiving spaces 431 and 432 are formed. In the receiving spaces 431 and 432, the first and the second spring portions 15 and 17 of the contacts 11 are located. The holding portions 13 of the contacts 11 are held by the center frame portion 29. The holding portions 13 of the contacts 11 are held by the center frame portion 29 when the insulator 421 is formed by insert-molding. The holding portions 13 of the contacts 11 may be held by the center frame portion 29 in other manners, for example, by forming holes in the center frame portion 29 and press-fitting the holding portions 13 into the holes or by welding the holding portions 13 to the center frame portion 29.

The structure in which the connector 401 is sandwiched between the printed boards 41 and 42 to connect the printed boards 41 and 42 as illustrated in FIGS. 13 and 14 and the example where the connector 401 is used in the camera assembly illustrated in FIG. 15 are similar to those described above and description thereof will be omitted.

Figure 28:
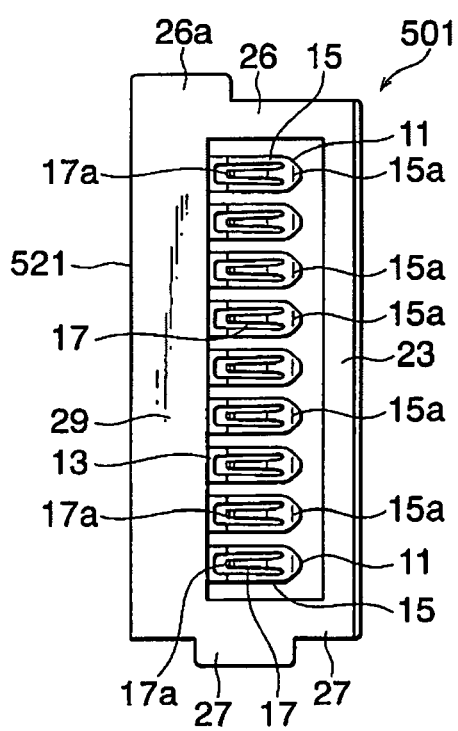
FIG. 28 is a plan view of a connector according to a sixth embodiment of this invention.

Referring to FIG. 28, a connector according to a sixth embodiment of this invention will be described. Similar parts are designated by like reference numerals and description thereof will be omitted.

The connector depicted at 501 in the figure comprises a plurality of conductive contacts 11 and an insulator 521 holding the contacts 11. Each contact 11 is similar in shape to the contact 11 described above. While the number of the contacts 11 is equal to seven in each single row in FIG. 27, the number of the contacts 11 is equal to nine in this embodiment.

The insulator 521 is formed by molding an insulating resin material. The insulator 521 has a longitudinal frame portion 23, a pair of transversal frame portions 26 and 27 having one ends connected to opposite ends of the longitudinal frame portion 23 and parallel to each other, and a center frame portion 29 having opposite ends connected to the other ends of the transversal frame portions 26 and 27. Thus, the insulator 521 has a shape such that only the other receiving portion 32 of the insulator 21 illustrated in FIG. 1 is formed.

In the receiving portion 32, the first and the second spring portions 15 and 17 of the contacts 11 are located. The holding portions 13 of the contacts 11 are held by the center frame portion 29.

The structure in which the connector 501 is sandwiched between the printed boards 41 and 42 to connect the printed boards 41 and 42 as illustrated in FIGS. 13 and 14 and the example where the connector 501 is used in the camera assembly illustrated in FIG. 15 are similar to those described above and description thereof will be omitted.

Figure 29:
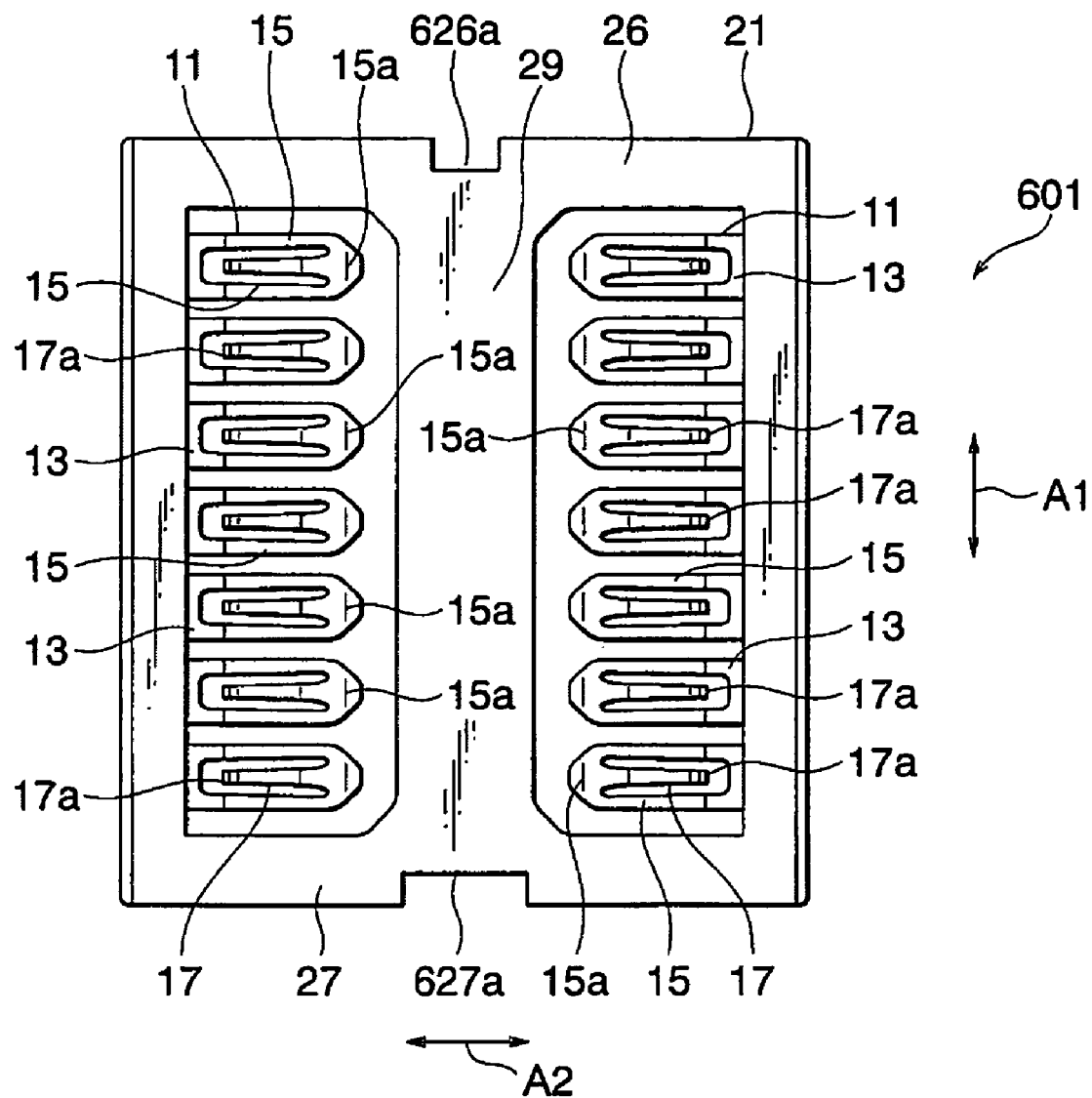
FIG. 29 is a plan view of a connector according to a seventh embodiment of this invention.

Referring to FIG. 29, a connector according to a seventh embodiment of this invention will be described. Similar parts are designated by like reference numerals and description thereof will be omitted.

The connector depicted at 601 in the figure has a first positioning portion 626a formed on an outer surface of one transversal frame portion 26 and dented from the outer surface. The first positioning portion 626a is located in an extension direction of the center frame portion 29. On an outer surface of the other transversal frame portion 27, a second positioning portion 627a dented from the outer surface is formed. The second positioning portion 627a is formed at a position in the extension direction of the center frame portion 29. The first and the second positioning portions 626a and 627a are different in width from each other in the longitudinal direction of the transversal frame portions 26 and 27.

The first and the second positioning portions 626a and 627a serve to position the connector 601. For example, the case 51 illustrated in FIG. 16 is provided with first and second positioning protrusions formed on its inner wall surface. By fitting the first and the second positioning portions 626a and 626b over the first and the second positioning protrusions, the connector 601 is positioned on the predetermined plane in the case 51.

Each of the above-mentioned connectors may be required to be small in size and thin in profile. When the connector is reduced in profile, the thickness of the insulator is reduced also.

Specifically, in case where the thickness of the insulator 21 is reduced in the connector 1 illustrated in FIGS. 1 through 14, it is necessary to design the connector 1 taking the warpage of the insulator 21 into consideration. The warpage of the insulator 21 is increased as the number of the contacts 1 is greater. The metal plate (strengthening plate) 30 for strengthening the insulator 21 described in connection with FIG. 4 may sometimes fail to cope with the reactive force of the insulator 20 if the thickness of the insulator 21 is reduced.

Therefore, in the connector 1 illustrated in FIGS. 1 through 14, in the assembling process described in connection with FIGS. 13 and 14, the warpage of the insulator 21 upon sandwiching the connector 1 between the printed boards 41 and 42 is corrected by fixing the connector 1 to the printed boards 41 and 42.

Figure 30:
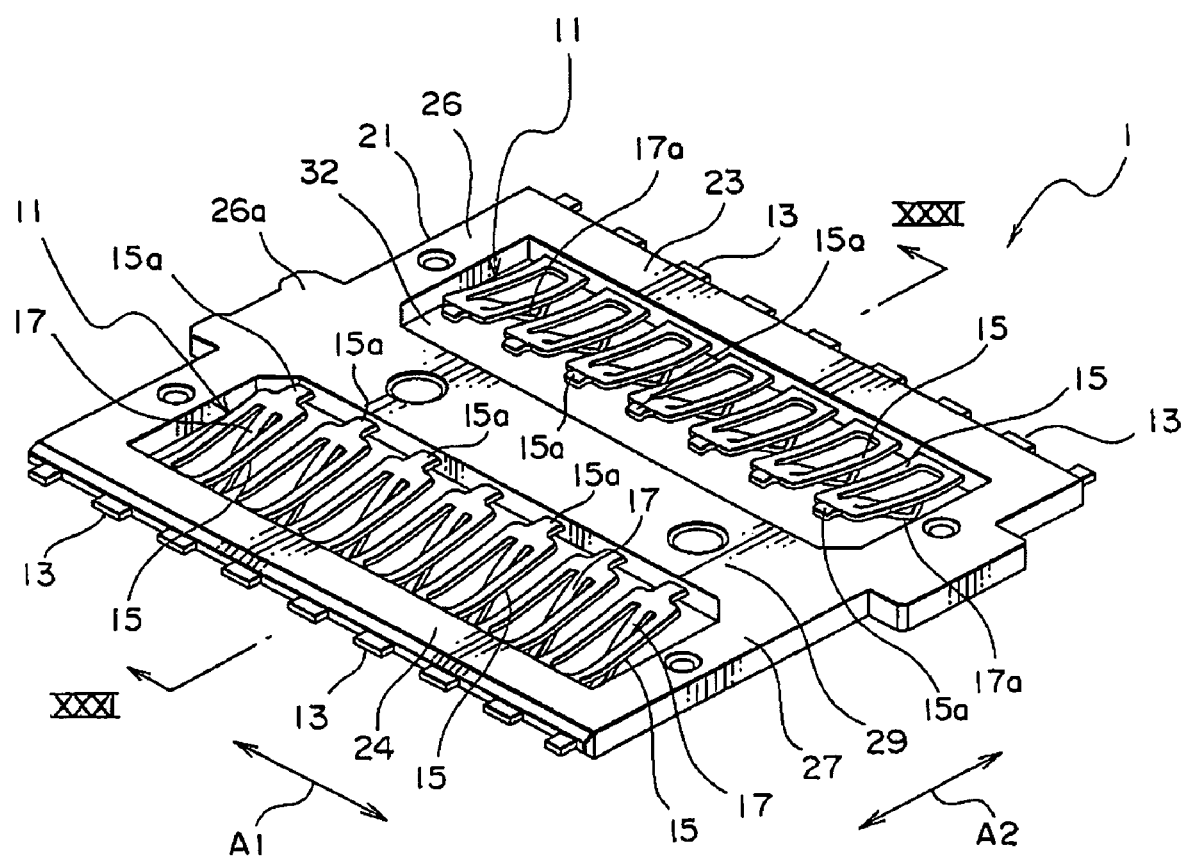
FIG. 30 is a perspective view for describing warpage of an insulator of a connector substantially same in structure as the connector illustrated in FIG. 1.
Figure 31:
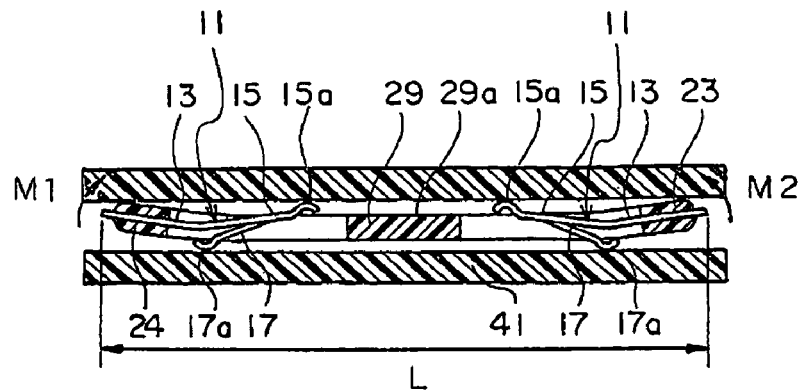
FIG. 31 is a sectional view taken along a line XXXI-XXXI in FIG. 30.

Referring to FIGS. 30 and 31, occurrence of warpage of the insulator 21 in the connector 1 will be described. In the connector 1 illustrated in FIGS. 30 and 31, the contact 11 is slightly different from the contact 11 in FIGS. 1 through 14 in shape of the first contacting portion 15a. However, the basic function is same. Therefore, similar parts are designated by like reference numerals and description thereof will be omitted. In the connector 1, the contacts 11 are arranged similar to one another in posture with respect to the predetermined plane.

When the connector 1 is sandwiched between the one printed board 41 and the other printed board 42, the first and the second contacting portions 15a and 17a are pressed so that the first and the second spring portions 15 and 17 are applied with a load. As a consequence, bending moments M1 and M2 are produced. The bending moments M1 and M2 thus produced act to rotate the contacts 11. As seen in a sectional view in FIG. 31, opposite sides of the insulator 21 are lifted up and the insulator 21 is deformed into a flattened U shape. Thereafter, when the insulator 21 is contacted with the one printed board 41, force including the reactive force by the warpage is balanced in the connector 1. In FIG. 31, a reference symbol L represents the distance between ends of the holding portions 13 of the contacts 11 disposed in parallel rows faced to each other.

Figure 32:
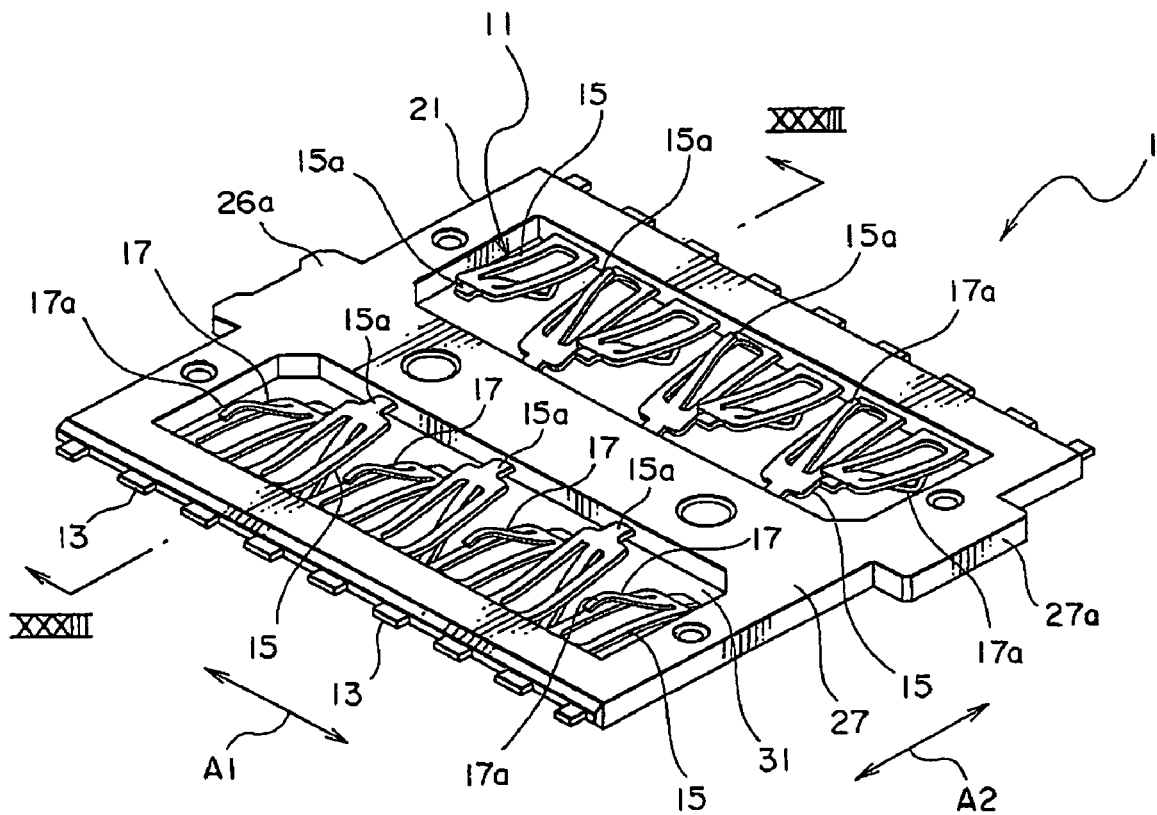
FIG. 32 is a perspective view of a connector according to an eighth embodiment of this invention.

Referring to FIG. 32, a connector according to an eighth embodiment of this invention will be described. Similar parts are designated by like reference numerals and description thereof will be omitted.

In FIG. 32, a plurality of contacts 11 are arranged in two parallel rows extending in a first direction A1 and faced to each other in a second direction A2. The contacts 11, seven in number, are disposed in each row and held by the insulator 21. The contacts 11 in the two parallel rows are arranged at the same pitch P (see FIG. 9) in the first direction A1 in a manner such that every adjacent ones of the contacts 11 adjacent in the first direction A1 are inverted in posture from each other in a thickness direction of the connector 1.

More particularly, the contacts 11 in one row are arranged in a first posture with respect to the predetermined plane. The contacts 11 in the other row are arranged in a second posture inverted from the first posture with respect to the predetermined plane.

Further, every pair of the contacts 11 arranged in one row and in the other row and faced to each other in the second direction A2 are inverted in posture from each other in the thickness direction. In the connector 1 illustrated in FIG. 32, the warpage of the insulator 21 illustrated in FIGS. 30 and 31 can be reduced.

Figure 33:
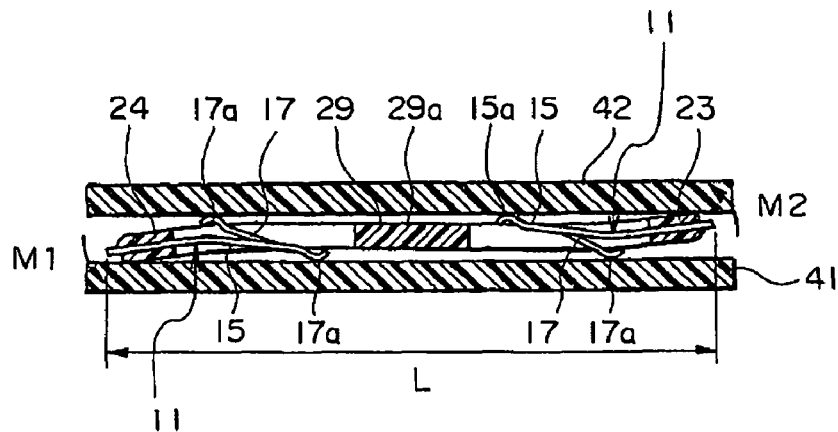
FIG. 33 is a sectional view taken along a line XXXIII-XXXIII in FIG. 32.

In the connector 1 illustrated in FIG. 32, the seven contacts 11 are held by the insulator 21 in each row. Thus, the number of the contacts 11 in each row is an odd number. If the insulator 21 of the connector 1 is reduced in thickness, the insulator 21 tends to be warped into a generally S shape in section because every pair of the contacts 11 faced to each other in the second direction A2 are inverted in posture from each other in the thickness direction. In FIG. 33, a reference symbol L represents the distance between ends of the holding portions 13 of the contacts 11 disposed in parallel rows faced to each other.

Figure 34:
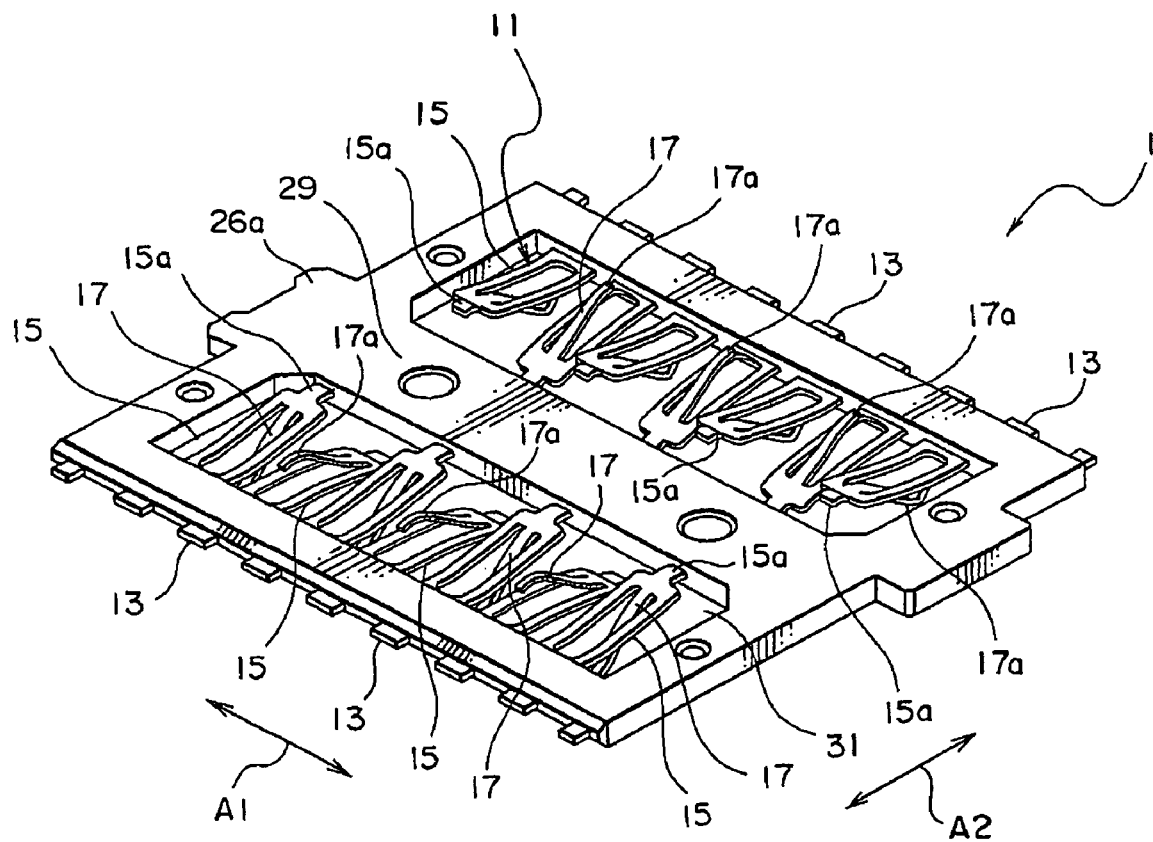
FIG. 34 is a perspective view of a connector according to a ninth embodiment of this invention.

Referring to FIG. 34, a connector according to a ninth embodiment of this invention will be described. Similar parts are designated by like reference numerals and description thereof will be omitted.

In FIG. 34, a plurality of contacts 11 are arranged in two parallel rows extending in a first direction A1 and faced to each other in a second direction A2. The contacts 11, seven in number, are disposed in each row and held by the insulator 21. The contacts 11 in each row are arranged at the same pitch P in the first direction A1 in a manner such that every adjacent ones of the contacts 11 adjacent in the first direction A1 are inverted in posture from each other in a thickness direction of the connector.

Further, every pair of the contacts 11 arranged in one row and in the other row and faced to each other in the second direction A2 are not inverted in posture from each other in the thickness direction.

In the connector illustrated in FIG. 34, every pair of the contacts 11 faced to each other in the second direction A2 are not inverted in posture from each other in the thickness direction. Therefore, the insulator 21 is warped in a generally U shape in section.

Now, consideration will be made about the warpage in each of the eighth and the ninth embodiments.

Equation (1) is a second-order differential equation for deflection. Herein, EI represents bending rigidity and M represents a moment or area at a predetermined distance from a fixed end.

$$EI\frac{d^2 y}{dx^2} = -M \tag{1}$$

According to Equation (1), the warpage of the connector 1 illustrated in FIG. 33 is obtained by the following Equation (2). Herein, each of M1 and M2 represents a moment of area at an end of each of the printed boards 41 and 42.

$$EI\frac{dy}{dx} = \frac{M1 - 2M2}{6}L = -\frac{1}{6}ML \tag{2}$$

Similarly, the warpage of the connector 1 illustrated in FIG. 34 is obtained by the following Equation (3):

$$EI\frac{dy}{dx} = \frac{M1 - 4M2}{6}L = -\frac{1}{2}ML \tag{3}$$

Herein, dy/dx represents a deflection angle which is equal to ½ in Equation (3) and is as small as ⅙ in Equation (2). Thus, in the connector 1 illustrated in FIG. 33, the deflection, i.e., the warpage is small. In case where each row includes an even number of the contacts 11, it is possible to prevent the insulator 21 from being warped.

Figure 35:
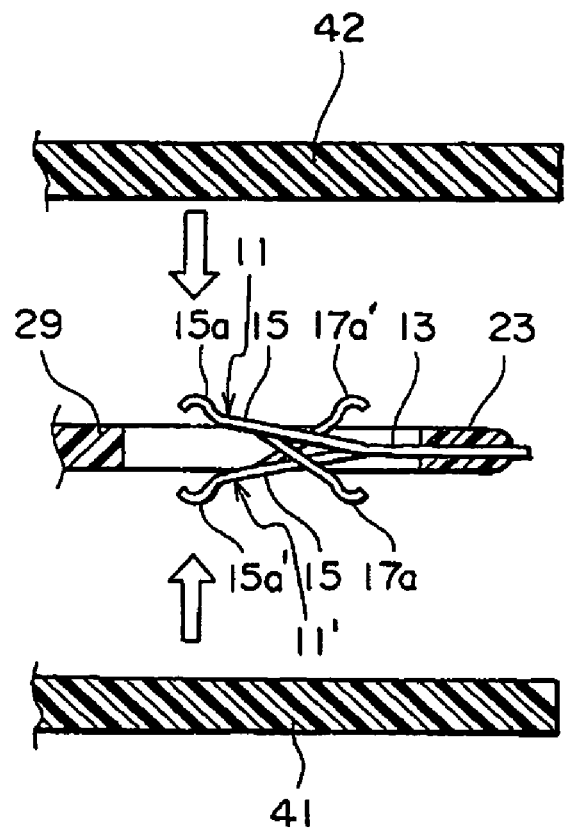
FIG. 35 is a sectional view of the connector illustrated in FIG. 34 together with a printed board, for describing reactive force of an insulator in case where the number of contacts in each row of the connector is an even number.

FIGS. 35 through 38 are views for describing the reason why the insulator 21 is not warped when each row includes an even number of the contacts 11. In FIG. 35, every two adjacent ones of the contacts 11 adjacent to each other in the first direction A1 and inverted in posture from each other in the thickness direction are depicted at 11 and 11', respectively.

Referring to FIG. 35, it is assumed that the contacts 11 and 11' are arranged at the same pitch P in a single row.

The first spring potions 15 and 15' serve to bring the first contacting portions 15a and 15a' into press contact with the printed boards 42 and 41, respectively. The second spring portions 17 and 17' serve to bring the second contacting portions 17a and 17a' into press contact with the printed boards 41 and 42, respectively.

Figure 36:
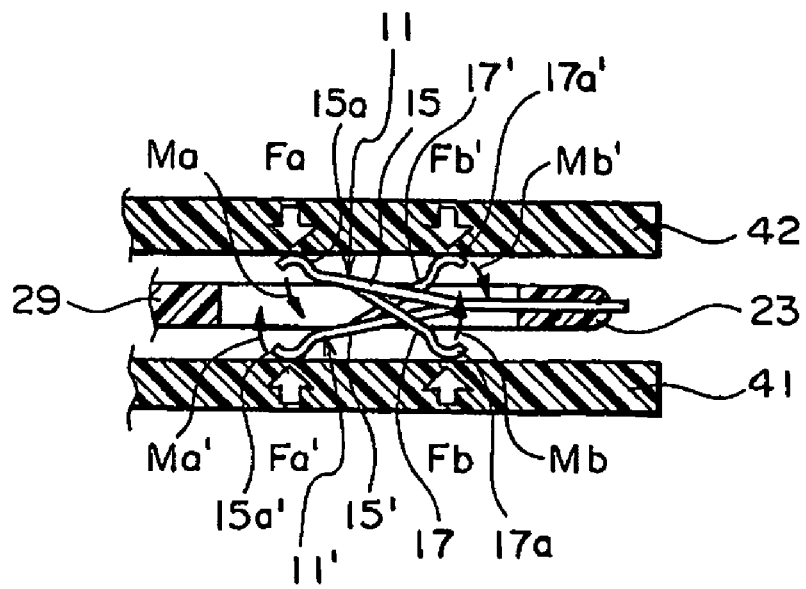
FIG. 36 is a sectional view of the connector and the printed board illustrated in FIG. 35 at an intermediate stage of assembling.

When the printed boards 41 and 42 are moved towards each other as illustrated in FIG. 36, the printed boards 41 and 42 press the first contacting portions 15a and 15a' with loads Fa and Fa'. As a consequence, bending moments Ma and Mb of the first and the second spring portions 15 and 17 of the contact 11 are produced in directions reverse to those of bending moments Ma' and Mb' of the first and the second spring portions 15' and 17' of the contact 11'.

Figure 37:
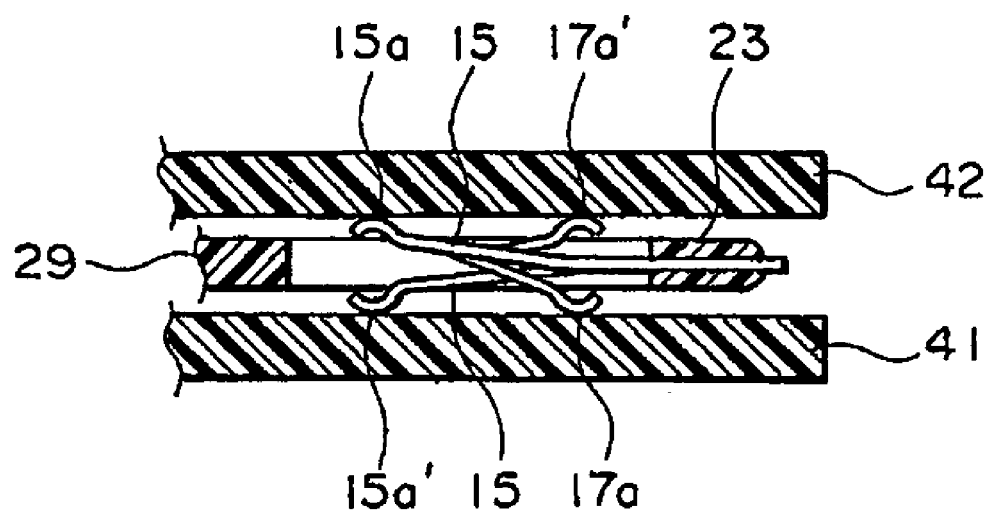
FIG. 37 is a sectional view similar to FIG. 36 at a later stage of assembling.
Figure 38:
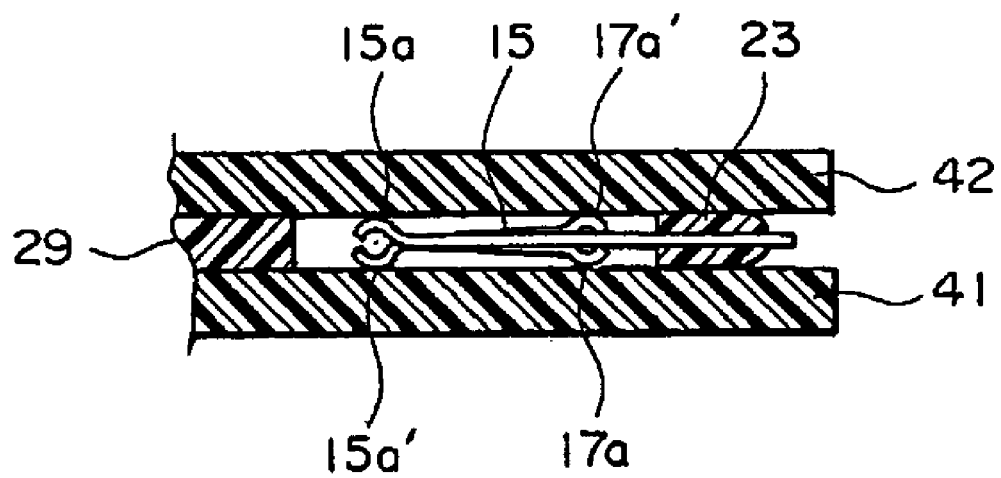
FIG. 38 is a sectional view of the connector and the printed board illustrated in FIG. 37 after completion of assembling.

Accordingly, as illustrated in FIG. 37, the bending moments of the adjacent ones of the contacts 11 and 11' in each row are cancelled with each other so that the warpage does not occur. In addition, all of the contacts 11 and 11' maintain the same contacting force and the reactive force due to the warpage does not occur as illustrated in FIG. 38.

While the present invention has thus far been described in connection with the preferred embodiments thereof, it will readily be possible for those skilled in the art to put this invention into practice in various other manners.

What is claimed is:

1. A connector for connecting first and second connection objects facing and parallel to each other, the connector comprising:
   an insulator; and
   a conductive contact coupled to the insulator,
   the contact comprising:
   a holding portion held by the insulator;
   a first spring portion extending from the holding portion towards one direction and including a first contacting portion to be connected to the first connection object and an intermediate portion between the first contacting portion and the holding portion; and
   a second spring portion extending from the intermediate portion towards the other direction opposite to the one direction and having a free end provided with a second contacting portion to be connected to the second connection object,
   wherein the holding portion extends from the insulator and has an extending end, and the first and the second spring portions are connected to the extending end,
   wherein the first spring portion has an opening which divides the first spring portion into two portions spaced from each other,
   wherein the second spring portion is positioned in the opening in planar view, and
   wherein the contact includes:
   first contacts arranged in a first row in a first posture with respect to the predetermined plane; and
   second contacts arranged in a second row opposite to the first row in a second posture inverted from the first posture with respect to the predetermined plane.

2. The connector according to claim 1, wherein the holding portion extends in a direction intersecting with the one and the other directions.

3. A connector for connecting first and second connection objects facing and parallel to each other, the connector comprising:
   an insulator; and
   a conductive contact coupled to the insulator,
   the contact comprising:
   a holding portion held by the insulator;
   a first spring portion extending from the holding portion towards one direction and including a first contacting portion to be connected to the first connection object and an intermediate portion between the first contacting portion and the holding portion; and
   a second spring portion extending from the intermediate portion towards the other direction opposite to the one direction and having a free end provided with a second contacting portion to be connected to the second connection object,
   wherein the second spring portion extends from a free end of the first spring portion,
   wherein the first spring portion has an opening which divides the first spring portion into two portions spaced from each other, wherein the second spring portion is positioned in the opening in planar view, and wherein the contact includes:

first contacts arranged in a first row in a first posture with respect to the predetermined plane; and second contacts arranged in a second row opposite to the first row in a second posture inverted from the first posture with respect to the predetermined plane.

4. The connector according to claim 3, wherein the contact is made by a plate-like material to form the first and the second spring portions.

5. The connector according to claim 4, wherein the first spring portion has a cutout portion and the second spring portion extends through the cutout and intersecting with the first spring portion.

6. A connector for connecting first and second connection objects facing and parallel to each other, the connector comprising:

an insulator; and a plurality of conductive contacts disposed on a predetermined plane and coupled to the insulator;

each of the contacts comprising:

a holding portion held by the insulator;

a first spring portion extending from the holding portion towards one direction and including a first contacting portion to be connected to the first connection object and an intermediate portion between the first contacting portion and the holding portion; and a second spring portion extending from the intermediate portion towards the other direction opposite to the one direction and having a free end provided with a second contacting portion to be connected to the second connection object, wherein the contacts include:

first contacts arranged in a first row in a first posture with respect to the predetermined plane; and second contacts arranged in a second row opposite to the first row in a second posture inverted from the first posture with respect to the predetermined plane, wherein the first spring portion has an opening which divides the first spring portion into two portions spaced from each other, and wherein the second spring portion is positioned in the opening in planar view.

7. The connector according to claim 6, wherein the first row extends in a first direction along the predetermined plane, the first and the second contacts being alternately arranged in the first row.

8. The connector according to claim 7, wherein the second row extends in parallel to the first row, the first and the second contacts being alternately arranged in the second row.

9. The connector according to claim 8, wherein the first and the second contacts are faced to each other in a second direction perpendicular to the first direction along the predetermined plane.

* * * * *